United States Patent
Arai et al.

(10) Patent No.: US 12,283,603 B2
(45) Date of Patent: Apr. 22, 2025

(54) IMAGING ELEMENT AND DISTANCE MEASUREMENT MODULE

(71) Applicant: SONY SEMICONDUCTOR SOLUTIONS CORPORATION, Kanagawa (JP)

(72) Inventors: Hideki Arai, Kanagawa (JP); Yusuke Otake, Kanagawa (JP); Takuro Murase, Kanagawa (JP); Takeshi Yamazaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 366 days.

(21) Appl. No.: 17/792,814

(22) PCT Filed: Jan. 18, 2021

(86) PCT No.: PCT/JP2021/001414
§ 371 (c)(1),
(2) Date: Jul. 14, 2022

(87) PCT Pub. No.: WO2021/153299
PCT Pub. Date: Aug. 5, 2021

(65) Prior Publication Data
US 2023/0038698 A1    Feb. 9, 2023

(30) Foreign Application Priority Data

Jan. 29, 2020  (JP) .................................. 2020-012437

(51) Int. Cl.
*H01L 27/146* (2006.01)
*G01S 7/4914* (2020.01)
(Continued)

(52) U.S. Cl.
CPC ...... *H01L 27/14636* (2013.01); *G01S 7/4914* (2013.01); *G01S 7/4915* (2013.01); *H01L 27/14638* (2013.01); *H04N 25/704* (2023.01)

(58) Field of Classification Search
CPC ......... H01L 27/14636; H01L 27/14638; G01S 7/4914; G01S 7/4915
See application file for complete search history.

(56) References Cited

U.S. PATENT DOCUMENTS

| | | | |
|---|---|---|---|
| 12,058,455 B2 * | 8/2024 | Kurihara | ................ H04N 25/79 |
| 12,149,845 B2 * | 11/2024 | Arai | ..................... H04N 25/772 |
| 2013/0032925 A1 | 2/2013 | Kitano et al. | |

FOREIGN PATENT DOCUMENTS

| | | |
|---|---|---|
| JP | 2009-212618 | 9/2009 |
| JP | 2013-038100 | 2/2013 |

(Continued)

OTHER PUBLICATIONS

Bamji et al., "1Mpixel 65nm BSI 320MHz Demodulated TOF Image Sensor with 3.5Ξm Global Shutter Pixels and Analog Binning," 2018 IEEE International Solid-State Circuits Conference, Session 5, 2018, pp. 94-96.

(Continued)

*Primary Examiner* — Tony Ko
(74) *Attorney, Agent, or Firm* — Sheridan Ross PC

(57) ABSTRACT

The present technique relates to an imaging element and a distance measurement module capable of reducing parasitic capacity. A distance measurement module includes: a first wiring that connects predetermined transistors in first adjacent pixels to a via formed in one of first adjacent pixels and connected to a wiring formed in another layer; and a second wiring that connects predetermined transistors in second adjacent pixels to a via formed in a pixel that is adjacent to one of second adjacent pixels and connected to a wiring formed in another layer, in which the first wiring is connected to a redundant wiring. The present technique can be applied to a distance measurement sensor that performs distance measurement, for example.

10 Claims, 29 Drawing Sheets

(51) Int. Cl.
 *G01S 7/4915* (2020.01)
 *H04N 25/704* (2023.01)

(56) References Cited

FOREIGN PATENT DOCUMENTS

JP    2020-009883    1/2020
WO   WO 2009/051499   4/2009

OTHER PUBLICATIONS

Bamji et al., "1Mpixel 65nm BSI 320MHz Demodulated TOF Image Sensor with 3.5Ξm Global Shutter Pixels and Analog Binning," Microsoft Corp. Presentation, Paper 5.8, Feb. 12, 2018, 26 pages.
Keel et al., "A 640x480 Indirect Time-of-Flight CMOS Image Sensor with 4-tap 7 Ξm Global-Shutter Pixel and Fixed-Pattern Phase Noise Self-Compensation Scheme," 2019 Symposium on VLSI Circuits Digest of Technical Papers, 2019, pp. C258-C259.
International Search Report and Written Opinion prepared by the Japan Patent Office on Mar. 2, 2021, for International Application No. PCT/JP2021/001414, 2 pgs.

\* cited by examiner

IMAGING ELEMENT AND DISTANCE MEASUREMENT MODULE

CROSS REFERENCE TO RELATED APPLICATIONS

This application is a national stage application under 35 U.S.C. 371 and claims the benefit of PCT Application No. PCT/JP2021/001414, having an international filing date of 18 Jan. 2021, which designated the United States, which PCT application claimed the benefit of Japanese Patent Application No. 2020-012437, filed 29 Jan. 2020, the entire disclosures of each of which are incorporated herein by reference.

TECHNICAL FIELD

The present technique relates to an imaging element and a distance measurement module, and particularly to an imaging element and a distance measurement module capable of achieving both reduction of a cyclic error and dispersion of a drive current.

BACKGROUND ART

A ToF sensor that measures a distance to an object by measuring a light flight time causes a light emitting source to output modulated light and receives reflected light that is reflected by and returned from the object. Although modulated light output from the light emitting source is regarded as having a sine waveform and is subjected to signal processing in measurement of a distance, light that is actually output from the light emitting source has a rectangular waveform, and a periodical error (hereinafter, referred to as a cyclic error) thus occurs in the measurement value by processing the rectangular wave as a sine wave.

For example, a technique of generating a pseudo sine wave by shifting a phase of modulated light output from a light emitting source and thereby reducing a cyclic error has been disclosed (see PTL 1, for example).

Also, there is a trend that the numbers of pixels in ToF sensors have increased in recent years. If a large number of pixels are driven at the same time, a drive current concentrates, and strong charging and discharged currents may cause an IR drop, and it may not be able to accurately drive the pixels. Therefore, a technique of reducing a peak current by dispersing pixel driving to prevent an IR drop has also been considered (see NPL 1 and 2, for example).

CITATION LIST

Patent Literature

[PTL 1]
  WO 2009/051499

Non Patent Literature

[NPL 1]
  Cyrus S Bamji, et al., 5.8 1 Mpixel 65 nm BSI 320 MHz Demodulated TOF Image Sensor with 3.5 um Global Shutter Pixels and Analog Binning, Microsoft Corp., 2018 IEEE International Solid-State Circuits Conference SESSION 5/IMAGE SENSORS, Feb. 12, 2018.
[NPL 2]
  Min-Sun Keel, et al., A 640×480 Indirect Time-of-Flight CMOS Image Sensor with 4-tap 7-µm Global-Shutter Pixel and Fixed-Pattern Phase Noise Self-Compensation Scheme, Samsung Electronics Co., Ltd., 2019 Symposium on VLSI Circuits Digest of Technical Papers.

SUMMARY

Technical Problem

However, the techniques in NPL 1 and NPL 2 do not take a cyclic error into consideration. A method for achieving both reduction of a cyclic error and dispersion of a drive current has not yet been proposed.

The present technique was made in view of such circumstances and is to enable both reduction of a cyclic error and dispersion of a drive current to be achieved.

Solution to Problem

An imaging element according to an aspect of the present technique includes: a first wiring that connects predetermined transistors in first adjacent pixels to a via formed in one of the first adjacent pixels and connected to a wiring formed in another layer; and a second wiring that connects predetermined transistors in second adjacent pixels to a via formed in a pixel that is adjacent to one of the second adjacent pixels and connected to a wiring formed in another layer, in which the first wiring is connected to a redundant wiring.

A distance measurement module according to an aspect of the present technique includes: a light emitting unit that emits irradiation light; and a light receiving element that receives reflected light obtained by reflecting light from the light emitting unit by an object, in which the light receiving element includes a photoelectric conversion unit that performs photoelectric conversion, a plurality of charge accumulation units that accumulate charge obtained by the photoelectric conversion unit, a plurality of transfer units that transfer the charge from the photoelectric conversion unit to each of the plurality of charge accumulation units, a first wiring that connects the transfer units in first adjacent pixels to a via formed in one of the first adjacent pixels and connected to a wiring formed in another layer, and a second wiring that connects the transfer units in second adjacent pixels to a via formed in a pixel adjacent to one of the second adjacent pixels and connected to a wiring formed in another layer, and the first wiring is connected to a redundant wiring.

The imaging element according to the aspect of the present technique includes: the first wiring that connects the predetermined transistors in first adjacent pixels to a via formed in one of the first adjacent pixels and connected to a wiring formed in another layer; and the second wiring that connects predetermined transistors in second adjacent pixels to a via formed in a pixel that is adjacent to one of the second adjacent pixels and connected to a wiring formed in another layer, and the first wiring is connected to the redundant wiring.

The distance measurement module according to the aspect of the present technique includes: the light emitting unit that emits irradiation light; and the light receiving element that receives reflected light obtained by reflecting the light from the light emitting unit by an object. The imaging element is included as the light receiving element.

The distance measurement module may be an independent device or may be a module incorporated in another device.

DESCRIPTION OF EMBODIMENTS

Modes for carrying out the present technique (hereinafter referred to as "embodiments") will be described below.

<Schematic Configuration Example of Distance Measurement Module>

Figure 1:
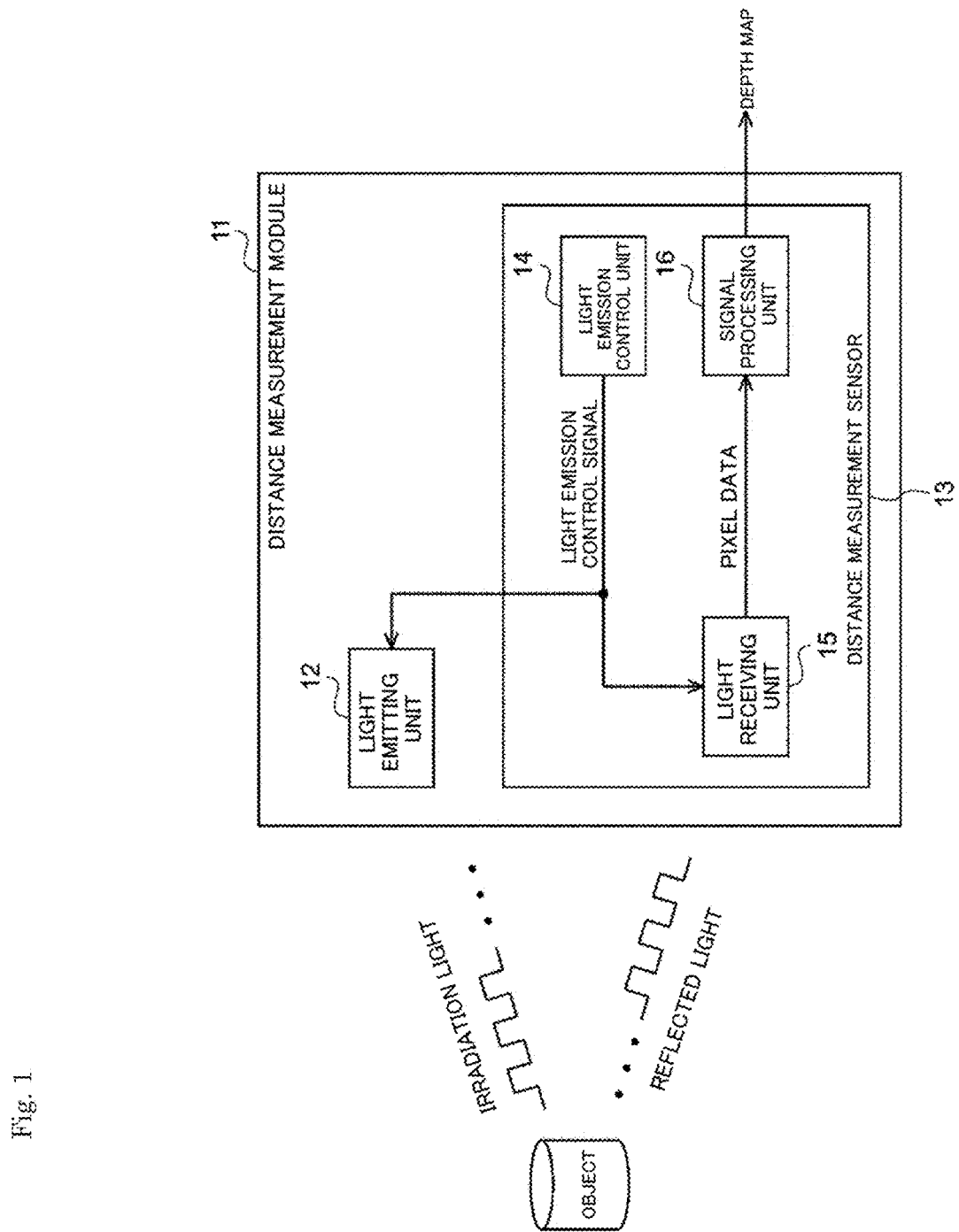
FIG. 1 is a block diagram illustrating a schematic configuration example of a distance measurement module to which the present technique is applied.

FIG. 1 is a block diagram illustrating a schematic configuration example of a distance measurement module to which the present technique is applied.

A distance measurement module 11 illustrated in FIG. 1 is a distance measurement module that performs distance measurement based on an indirect ToF scheme and includes a light emitting unit 12 and a distance measurement sensor 13. The distance measurement module 11 irradiates an object with light, receives light (reflected light) of the light (irradiation light) reflected by the object, and thus generates and outputs a depth map as information regarding the distance to the object. The distance measurement sensor 13 is configured by a light emission control unit 14, a light receiving unit 15, and a signal processing unit 16.

The light emitting unit 12 includes, as a light emitting source, a vertical cavity surface emitting laser (VCSEL) array in which a plurality of VCSELs are aligned in a planar shape, for example, emits light while modulating the light at a timing in accordance with a light emission control signal supplied from the light emission control unit 14, and irradiates an object with irradiation light.

The light emission control unit 14 controls the light emitting unit 12 by supplying a light emission control signal at a predetermined frequency (200 MHz, for example) to the light emitting unit 12. Also, the light emission control unit 14 also supplies a light emission control signal to the light receiving unit 15 in order to drive the light receiving unit 15 at the timing of light emission performed by the light emitting unit 12.

The light receiving unit 15 receives light reflected by the object with a pixel array unit 32 in which a plurality of pixels 31 are two-dimensionally arranged though details will be described later with reference to FIG. 2. Also, the light receiving unit 15 supplies pixel data configured by a detection signal in accordance with the light reception amount of received reflected light to a signal processing unit 16 in units of pixels 31 in the pixel array unit 32.

The signal processing unit 16 calculates a depth value that is the distance between the distance measurement module 11 and the object on the basis of the pixel data supplied from the light receiving unit 15 for each pixel 31 in the pixel array unit 32, generates a depth map in which the depth value is stored as a pixel value of each pixel 31, and outputs the depth map to the outside of the module.

<Basic Pixel Drive Based on Indirect ToF Scheme>

Prior to description of details of pixel drive executed by the light receiving unit 15 according to the present disclosure, basic pixel drive based on the indirect ToF scheme (basic pixel drive) will be described.

Figure 2:
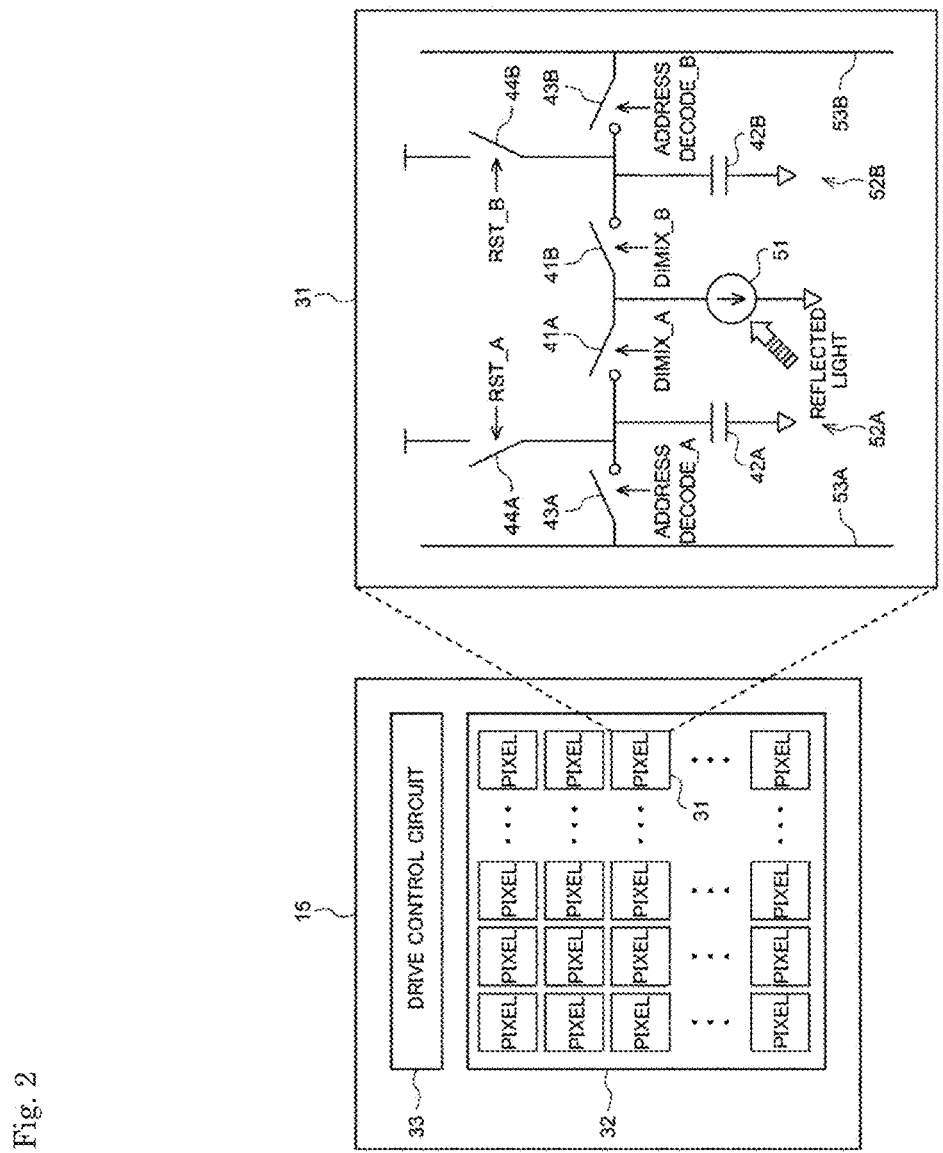
FIG. 2 is a block diagram illustrating a detailed configuration example of a light receiving unit.

FIG. 2 is a block diagram illustrating a detailed configuration example of the light receiving unit 15.

The light receiving unit 15 includes the pixel array unit 32 in which the pixels 31 that generate charge in accordance with the amount of received light and output detection signals in accordance with the charge are two-dimensionally arranged in a matrix shape in a row direction and a column direction and a drive control circuit 33 that is disposed in a surrounding region of the pixel array unit 32.

The drive control circuit 33 outputs control signals for controlling driving of the pixels 31 (for example, an allocation signal DIMIX, a selection signal ADDRESS DECODE, and a reset signal RST, which will be described later) on the basis of the light emission control signal and the like supplied from the light emission control unit 14, for example.

Each pixel 31 includes a photodiode 51 that serves as a photoelectric conversion unit that generates charge in accordance with the amount of received light and a tap 52A and a tap 52B that detect the charge generated by the photodiode 51. In the pixel 31, charge generated by one photodiode 51 is allocated to the tap 52A or the tap 52B. Out of the charge generated by the photodiode 51, the charge allocated to the tap 52A is output as a detection signal A from a signal line 53A, and the charge allocated to the tap 52B is output as a detection signal B from a signal line 53B.

The tap 52A is configured by a transfer transistor 41A, a floating diffusion (FD) unit 42A, a select transistor 43A, and a reset transistor 44A. Similarly, the tap 52B is configured by a transfer transistor 41B, an FD unit 42B, a select transistor 43B, and a reset transistor 44B.

Figure 3:
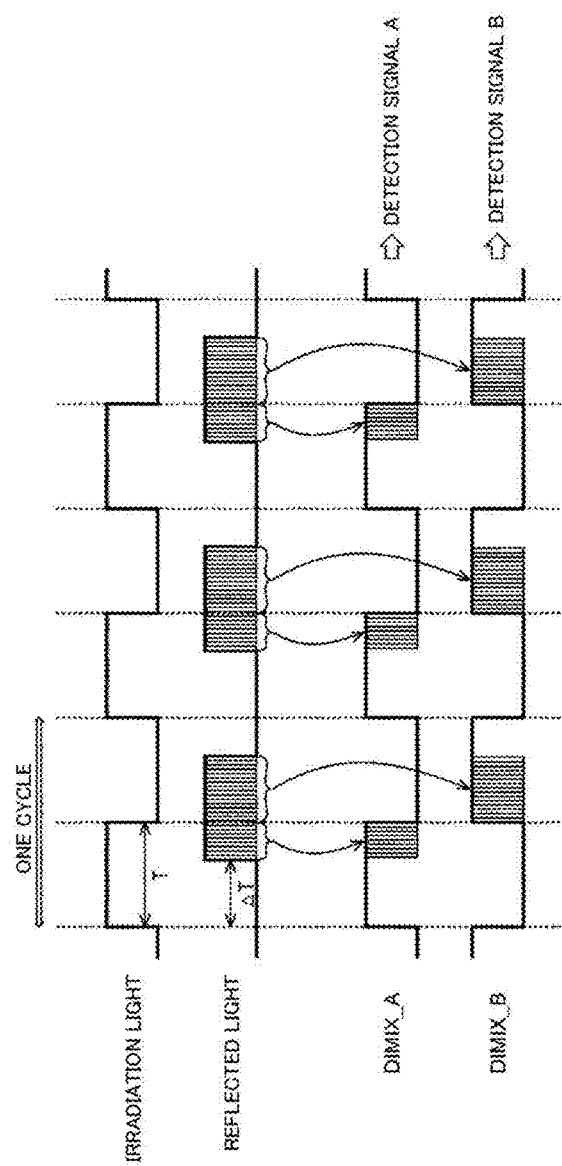
FIG. 3 is a diagram for explaining operations of a pixel.

Irradiation light modulated (1 cycle=2 T) such that on/off of irradiation is repeated at an irradiation time T as illustrated in FIG. 3 is output from the light emitting unit 12, and reflected light is received by the photodiode 51 with a delay of a delay time $\Delta T$ in accordance with the distance to the object. Also, an allocation signal DIMIX_A is for controlling ON/OFF of the transfer transistor 41A, and an allocation signal DIMIX_B is for controlling ON/OFF of the transfer transistor 41B. The allocation signal DIMIX_A is a signal in the same phase as that of the irradiation light, and the allocation signal DIMIX_B is in a phase inverted from that of the allocation signal DIMIX_A.

Thus, the charge generated by the photodiode 51 receiving the reflected light is transferred to the FD unit 42A when the transfer transistor 41A is turned on in accordance with the allocation signal DIMIX_A or is transferred to the FD unit 42B when the transfer transistor 41B is turned on in accordance with the allocation signal DIMIX_B, in FIG. 2. In this manner, the charge transferred via the transfer transistor 41A is successively accumulated in the FD unit 42A, and the charge transferred via the transfer transistor 41B is successively accumulated in the FD unit 42B in a predetermined period during which irradiation with the irradiation light in an irradiation time T is cyclically performed.

Once the select transistor 43A is turned on in accordance with a selection signal ADDRESS DECODE_A after the period of accumulating the charge ends, the charge accumulated in the FD unit 42A is read via the signal line 53A, and the detection signal A in accordance with the amount of charge is output from the light receiving unit 15. Similarly, once the select transistor 43B is turned on in accordance with a selection signal ADDRESS DECODE_B, the charge accumulated in the FD unit 42B is read via the signal line 53B, and the detection signal B in accordance with the amount of charge is output from the light receiving unit 15. Also, the charge accumulated in the FD unit 42A is discharged when the reset transistor 44A is turned on in accordance with a reset signal RST_A, and the charge accumulated in the FD unit 42B is discharged when the reset transistor 44B is turned on in accordance with a reset signal RST_B.

In this manner, the pixel 31 allocates the charge generated by the reflected light received by the photodiode 51 to the tap 52A or the tap 52B in accordance with the delay time $\Delta T$ and outputs the detection signal A and the detection signal B as pixel data.

The signal processing unit 16 calculates a depth value on the basis of the detection signal A and the detection signal B supplied as pixel data from each pixel 31. The calculation of the depth value will be described later with reference to FIG. 7.

<Structure of Unit Pixel>

Next, a specific structure of the pixels 31 arranged in a matrix shape in the pixel array unit 32 will be described.

Each pixel 31 includes a photodiode 51 (hereinafter, referred to as a PD 51) that is a photoelectric conversion element and is configured such that the charge generated by the PD 51 is allocated to the tap 52A and the tap 52B. In the charge generated by the PD 51, the charge allocated to the tap 52A is read from a vertical signal line 53A and is then output as a detection signal SIG1. Also, the charge allocated to the tap 52B is read from a vertical signal line 53B and is then output as a detection signal SIG2.

Configurations of the tap 52A and the tap 52B are basically similar to each other. Both the tap 52A and the tap 52B realize FD-type global shutters. In the example in FIG. 4, the tap 52A of the pixel 31 in the pixel array unit 32 includes, for example, a transfer transistor (TG) 41A, a floating diffusion (FD) 42A that serves as a charge holding unit and a charge-voltage conversion unit, a select transistor (SEL) 43A, a reset transistor (RST) 44A, an amplification transistor (AMP) 45A, a feedback enable transistor (FBEN) 46A, a discharge transistor (OFG) 47, a conversion efficiency switching transistor (FDG) 48A, and an additional capacity unit 49A.

Similarly, the tap 52B is configured by a transfer transistor 41B, an FD 42B, a select transistor 43B, a reset transistor 44B, an amplification transistor 45B, an FBEN 46B, an FDG 48B, and an additional capacity unit 49B.

Figure 4:
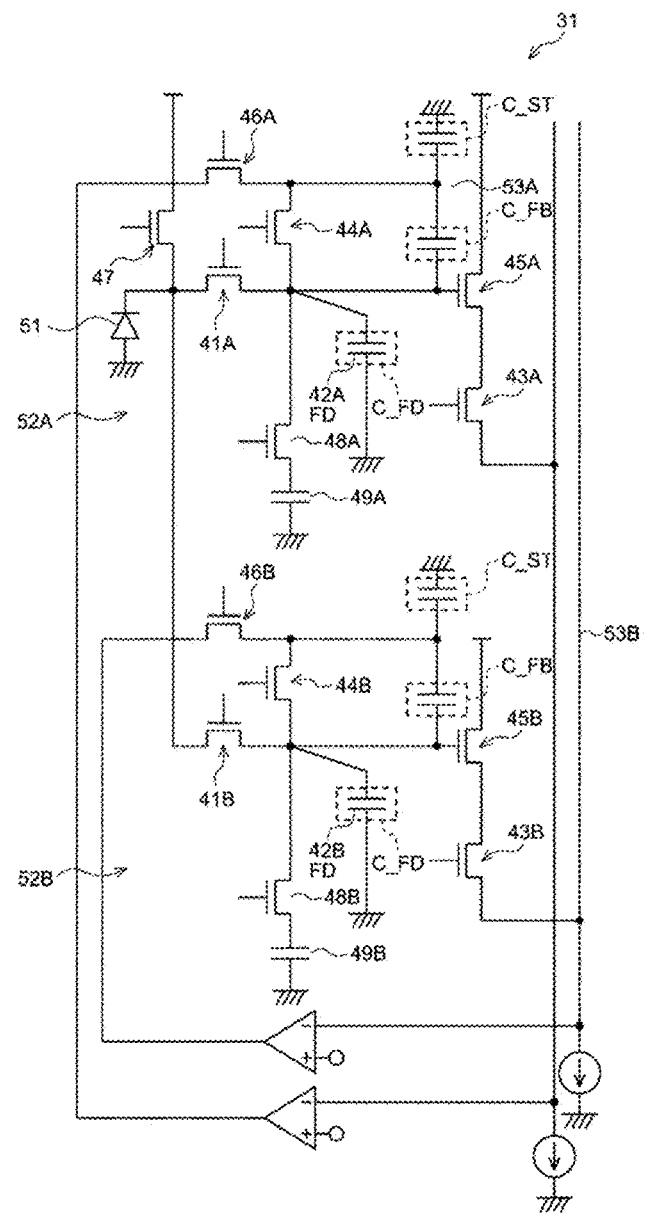
FIG. 4 is a diagram illustrating a circuit configuration example of a pixel.

Note that a configuration in which the reset transistor 44 is provided in each of the FD 42A and the FD 42B as illustrated in FIG. 4 may be employed, or a configuration in which the reset transistor 44 is shared by the FD 42A and the FD 42B may be employed.

In a case in which the configuration in which the reset transistors 44A and 44B are provided in the FD 42A and FD 42B, respectively as illustrated in FIG. 4 is employed, reset timings of the FD 42A and the FD 42B can be individually controlled, and it is thus possible to perform fine control. When the configuration in which the reset transistor 44 is provided commonly for the FD 42A and the FD 42B is employed, the reset timings for the FD 42A and the FD 42B can be the same, and it is thus possible to simplify the control and also to simplify the circuit configuration.

In the following description, the configuration in which the reset transistor 44 is provided in each of the FD 42A and the FD 42B will be described as an example. Also, in the following description with reference to FIG. 4, the tap 52A and the tap 52B basically have similar configurations, and the tap 52A will thus be described as an example.

In the example illustrated in FIG. 4, all of a TG 41A, an FD 42A, an SEL 43A, an RST 44A, an AMP 45A, an FBEN 46A, and an OFG 47 are N-type MOS transistors. A drive signal is supplied to each of gate electrodes of the TG 41A, the FD 42A, the SEL 43A, the RST 44A, the AMP 45A, the FBEN 46A, and the OFG 47. Each drive signal is a pulse signal that corresponds to an active state, that is, an ON state, in a high-level state and corresponds to a non-active state, that is, an OFF state, in a low-level state. Note that in the following description, bringing the drive signal into an active state will also be referred to as turning on the drive signal and bringing the drive signal into a non-active state will also be referred to as turning off the drive signal.

The PD 51 is a photoelectric conversion element configured by a PN-junction photodiode and functions as a photoelectric conversion unit that receives light from an object, generates charge in accordance with the amount of received light through photoelectric conversion, and accumulates the charge.

The TG 41A is connected between the PD 51 and the FD 42A and functions as a transfer unit that transfers the charge accumulated in the PD 51 to the FD 42A in accordance with a drive signal applied to the gate electrode of the TG 41A.

The FD 42A functions as a charge holding unit that temporarily holds charge accumulated in the PD 51 in order to realize a global shutter function. Also, the FD 42A is also a floating diffusion region that converts the charge transferred from the PD 51 via the TG 41A into an electrical signal (a voltage signal, for example) and outputs the electrical signal. An RST 44A is connected to the FD 42A, and a VSL 53A is also connected thereto via the AMP 45A and the SEL 43A.

Moreover, an additional capacity unit 49A that is a floating diffusion region (FD) that converts the charge into an electrical signal, for example, a voltage signal is also connected to the FD 42A via the FDG 48A. Note that although the additional capacity unit 49A is a floating diffusion region (FD), the additional capacity unit 49A also operates with the capacity in the same manner as the FD 42, and it is thus assumed that the additional capacity unit 49A is expressed using the capacitor circuit sign.

The FDG 48A switches a connection state of the FD 42A and the additional capacity unit 49A between an electrically connected state and an electrically separated state by being turned on and off in accordance with a drive signal FDG. The FDG 48A functions as an addition control unit that controls addition of the additional capacity unit 49A.

The drive signal FDG is supplied to a gate electrode configuring the FDG 48A, and once the drive signal FDG is turned on, the potential immediately below the FDG 48A becomes deep, and electrical connection is established between the FD 42A and the additional capacity unit 49A.

On the other hand, once the drive signal FDG is turned off, the potential immediately below the FDG 48A becomes shallow, and the FD 42A and the additional capacity unit 49A are electrically separated. Therefore, it is possible to add the capacity to the FD 42A and to change sensitivity of the pixel by turning on and off the drive signal FDG. Specifically, if it is assumed that when the amount of change in accumulated charge is defined as $\Delta Q$, a change in voltage at that time is defined as $\Delta V$, and the amount of capacity is defined as C, a relationship of $\Delta V = \Delta Q/C$ is established.

Now, if it is assumed that the capacity value of the FD 42A is defined as CFD and the capacity value of the additional capacity unit 49A is defined as CFD2, a capacity value C in a region of a pixel from which signal level reading is performed is CFD+CFD2 in a state in which the drive signal FDG is turned on. On the other hand, if the drive signal FDG is turned off, the capacity value C changes to CFD, and sensitivity of a voltage in response to the amount of change in charge (the amount of change in voltage: FD conversion efficiency) is thus enhanced.

In this manner, sensitivity of the pixel is appropriately changed by the pixel 31 turning on and off the drive signal FDG. Once the drive signal FDG is turned on, for example, the additional capacity unit 49A is electrically connected to the FD 42A, and a part of charge transferred from the PD 51 to the FD 42A is also accumulated not only in the FD 42A but also in the additional capacity unit 49A.

The RST 44A includes a drain connected to the FBEN 46A and a source connected to the FD 42A. The RST 44A functions as a reset unit that initializes, that is, resets the FD 42A in accordance with a drive signal applied to a gate electrode thereof. Note that a drain of the RST 44A forms a parasitic capacity C_ST with the ground and forms a parasitic capacity C_FB with the gate electrode of the AMP 45A as illustrated in FIG. 4.

The FBEN 46A functions as a reset voltage control unit that controls a reset voltage to be applied to the RST 44A.

The OFG 47 includes a drain connected to a power source VDD and a source connected to the PD 51. A cathode of the PD 51 is commonly connected to a source of the OFG 47 and a source of the TG 41A. The OFG 47 initializes, that is, resets the PD 51 in accordance with a drive signal applied to a gate electrode thereof. Resetting of the PD 51 means depleting of the PD 51.

The AMP 45A includes a gate electrode connected to the FD 42A and a drain connected to the power source VDD and serves as an input unit of a source follower circuit that reads charge obtained through photoelectric conversion at the PD 51. In other words, the AMP 45A configures a source follower circuit along with a constant current source connected to one end of the VSL 53A by the source thereof being connected to the VSL 53A via the SEL 43A.

The SEL 43A is connected between the source of the AMP 45A and the VSL 53A, and a select signal is supplied to the gate electrode of the SEL 43A. If the select signal of the SEL 43A is turned on, then the SEL 43A is brought into a power distributed state, and the tap 52A of the pixel 31 where the SEL 43A is provided is brought into a selected state. Once the tap 52A of the pixel 31 is brought into a selected state, a pixel signal output from the AMP 45A is read by the column signal processing unit 23 via the VSL 53A.

Also, a plurality of pixel drive lines (not illustrated) are arranged for each pixel row, for example, in the pixel array unit 32. Also, each drive signal is supplied from the vertical driving unit 2 to the selected pixel 31 through the plurality of pixel drive lines.

Each component configuring the tap 52B is also configured and operates in the same manner as each component configuring the aforementioned tap 52A.

Note that the pixel circuit illustrated in FIG. 4 is an example of a pixel circuit that can be used in the pixel array unit 32 and can also be used in a pixel circuit with another configuration.

<Planar Configuration Example of Pixel>

Figure 5:
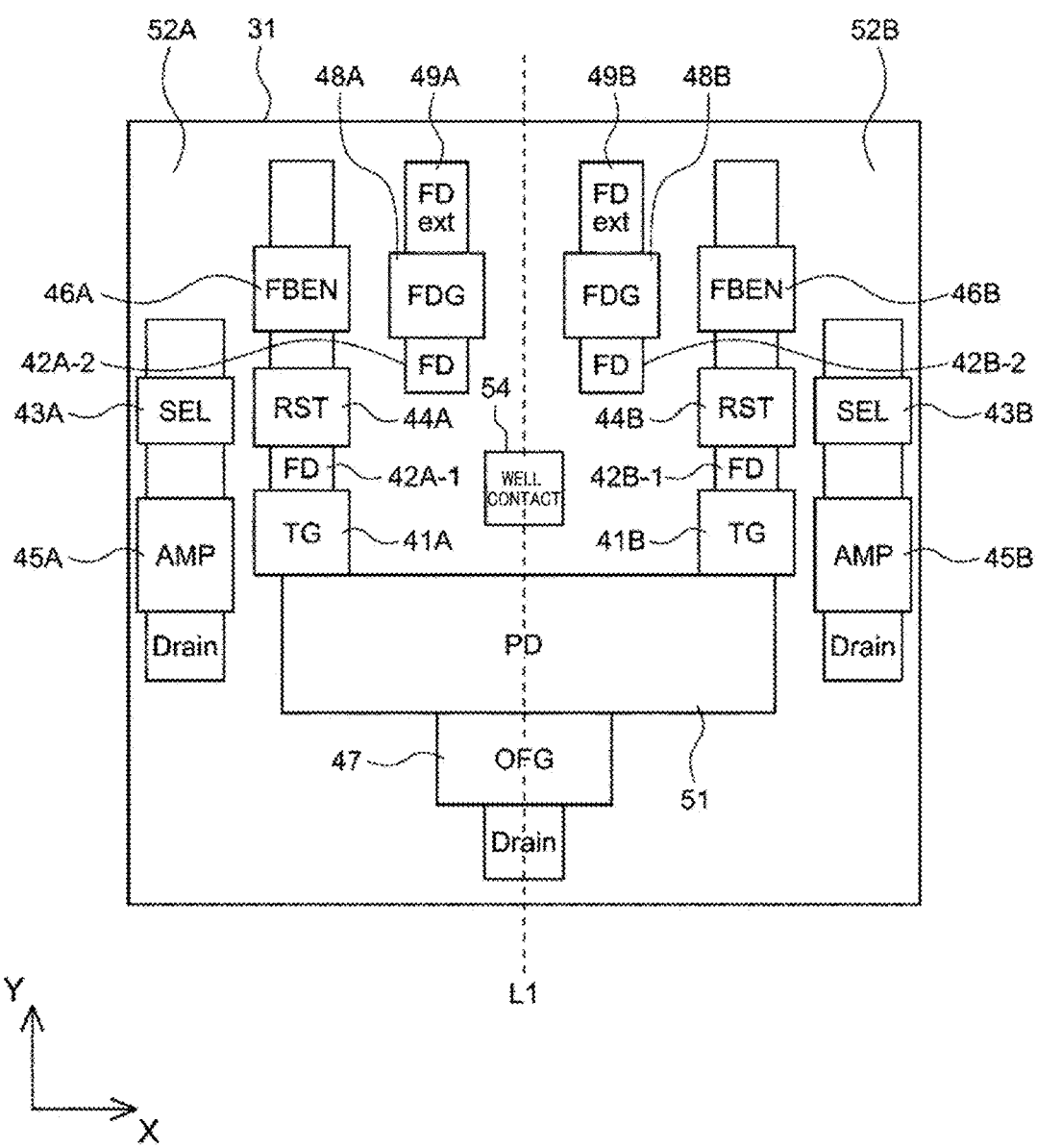
FIG. 5 is a diagram illustrating a planar configuration example of a pixel.

A planar configuration example of each pixel 31 corresponding to the circuit configuration example illustrated in FIG. 4 is illustrated in FIG. 5.

As illustrated in FIG. 5, the PD 51 is provided in a region near the center of the rectangular pixel 31. A TG 41A and a TG 41B are provided on the upper side (top side) of the PD 51 in the drawing. The TG 41A is a gate portion of the transfer transistor 41A, and the TG 41B is a gate portion of the transfer transistor 41B.

Each of the TG 41A and the TG 41B is provided to be adjacent to one side out of the four sides of the PD 51. In the example illustrated in FIG. 5, the TG 41A and the TG 41B are disposed side by side in the X-axis direction of the top side of the PD 51.

An FD 42A-1 is provided on the upper side of the TG 41A. The FD 42A-1 configures a part of the FD 42A included in the tap 52A.

The FD 42A included in the tap 52A is configured by the FD 42A-1 and the FD 42A-2. The FD 42A-1 and the FD 42A-2 are formed in different regions. The FD 42A-1 is formed on the upper side of the TG 41A in the drawing, and the FD 42A-2 is formed at a position separated from the FD 42A-1 and at a position obliquely above and to the right of the FD 42A-1. As will be described later, the FD 42A-1 and the FD 42A-2 are connected with a wiring in a wiring layer and are configured to be regarded as one region.

The FDG 48A is formed on the upper side of the FD 42A-2 in the drawing. Also, the additional capacity unit 49A is formed on the upper side of the FDG 48A in the drawing. Once the FDG 48A is turned on, a state in which three regions, namely the FD 42A-1, the FD 42A-2, and the additional capacity unit 49A are connected is achieved.

(A gate portion of) the amplification transistor 45A included in the tap 52A is formed on the left side of the TG 41A in the drawing. Also, (a gate portion of) the select transistor 43A is formed on the upper side of the TG 41A in the drawing. Moreover, the tap 52A is also provided with the FBEN 46A, and the FBEN 46A is formed on the upper side of the reset transistor 44A in the drawing.

In this manner, the FD 42A is formed in a dispersed manner in the two regions, namely the FD 42A-1 and the FD 42A-2. The RST 44A is connected to the FD 42A-1, and the FBEN 46A is connected to the RST 44A. The FDG 48A is connected to the FD 42A-2. By disposing the FD 42A in a split manner in the two regions, namely the FD 42A-1 and the FD 42A-2, it is possible to connect the FBEN 46A to one of them via the RST 44A and to connect the FDG 48A to the other one of them.

Each portion forming the tap 52B is disposed on the right side of the tap 52A in the drawing. The tap 52B also has a configuration similar to that of the tap 52A.

The TG 41B included in the tap 52B is formed on the right side of the PD 51 in the drawing. An FD 42B-1 is provided on the upper side of the TG 41B in the drawing. The FD 42B included in the tap 52B is configured by an FD 42B-1 and an FD 42B-2. The FD 42B-1 is formed on the upper side of the TG 41B in the drawing, and the FD 42B-2 is formed at a position separated from the FD 42B-1 and at a position obliquely above and to the left of the FD 42B-1. As will be described later, the FD 42B-1 and the FD 42B-2 are connected with a wiring in a wiring layer and are configured to be regarded as one region.

The FDG 48B is formed on the upper side of the FD 42B-2 in the drawing. Also, the additional capacity unit 49B is formed on the upper side of the FDG 48B in the drawing. Once the FDG 48B is turned on, a state in which three regions, namely the FD 42B-1, the FD 42B-2, and the additional capacity unit 49B are connected is achieved.

(A gate portion of) the amplification transistor 45B included in the tap 52B is formed on the right side of the TG 41B in the drawing. (A gate portion of) the select transistor 43B is formed on the upper side of the TG 41B in the drawing. Moreover, the tap 52B is also provided with the FBEN 46B, and the FBEN 46B is formed on the upper side of the reset transistor 44B in the drawing.

A well contact 54 is provided on the upper side of the PD 51. (A gate portion of) a discharge transistor (OFG) 47 is provided on the lower side of the PD 51. The discharge transistor 47 is an overflow gate for preventing blooming and is configured to be shared by the tap 52A and the tap 52B, and one OFD 47 is thus formed in the pixel 31 as illustrated in FIG. 5.

The disposition illustrated in FIG. 5 and below is an example and is not description indicating a limit. Also, although the configuration in which the discharge transistor 47 is provided will be described in the example illustrated in FIG. 5 and below, it is also possible to employ a configuration in which the discharge transistor 47 is not provided.

In the example illustrated in FIG. 5, each part configuring the tap 52A and each part configuring the tap 52B are linearly symmetrically disposed with reference to a center line L1 (the line L1 illustrated by a dotted line in the drawing) of the pixel 31.

In other words, the TG 41A, the FD 42A-1, the FD 42A-2, the reset transistor 44A, the FBEN 46A, the amplification transistor 45A, the select transistor 43A, the FDG 48A, and the additional capacity unit 49A configuring the tap 52A and the TG 41B, the FD 42B-1, the FD 42B-2, the reset transistor 44B, the FBEN 46B, the amplification transistor 45B, the select transistor 43B, the FDG 48B, and the additional capacity unit 49B configuring the tap 52B are linearly symmetrically disposed.

Although wiring is not illustrated in FIG. 5, the FD 42A-1 and the amplification transistor 45A are connected and configured such that the amount of signals from the FD 42A-1 is supplied to the amplification transistor 45A. Also, the FD 42B-1 and the amplification transistor 45B are also connected and configured such that the amount of signals from the FD 42B-1 is supplied to the amplification transistor 45B.

It is possible to set the length of the wiring between the FD 42A-1 and the amplification transistor 45A and the length of the wiring between the FD 42B-1 and the amplification transistor 45B to be substantially the same by employing the linearly symmetrical configuration as described above. Also, it is possible to obtain the same length of another wiring by employing horizontal target wiring.

<Sectional Configuration Example of Pixel>

Figure 6:
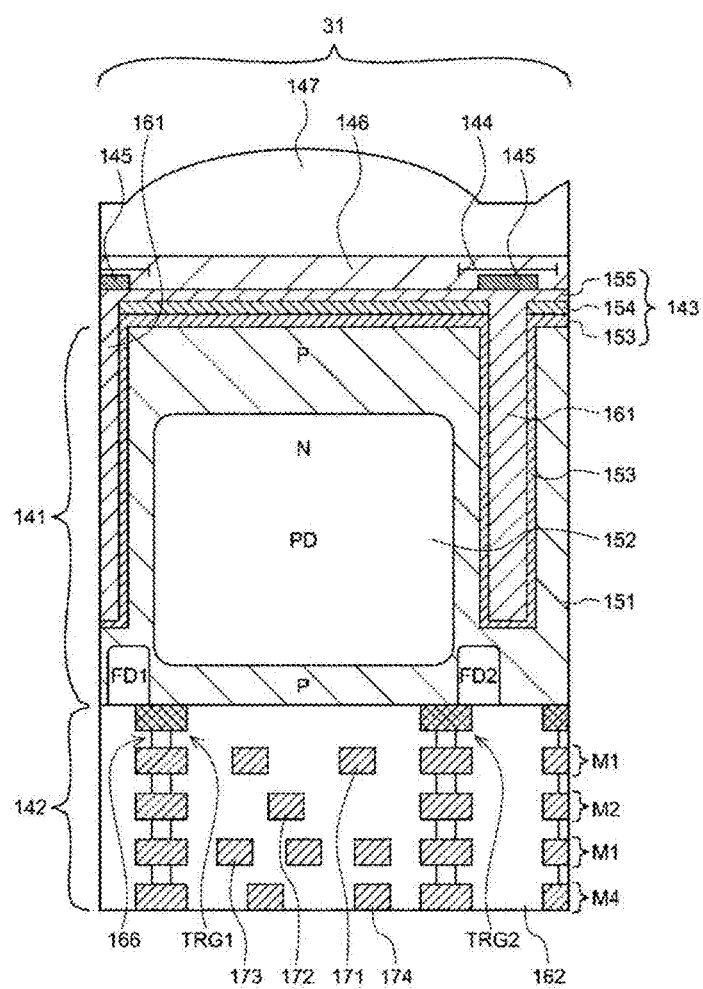
FIG. 6 is a diagram illustrating a sectional configuration example of a pixel.

FIG. 6 is a diagram illustrating a sectional configuration example of each pixel 31 including the two taps 52 illustrated in FIGS. 4 and 5.

The pixel 31 includes a semiconductor substrate 141 and a multi-layer wiring layer 142 formed on the front surface side (the lower side in the drawing).

The semiconductor substrate 141 is formed of, for example, silicon (Si) and is formed to have a thickness of, for example, approximately several μm. In the semiconductor substrate 141, N-type (second conductive type) semiconductor regions 152 are formed in units of pixels in P-type (first conductive type) semiconductor regions 151, and photodiodes 51 are thus formed in units of pixels, for example. The P-type semiconductor regions 151 provided on both the front surface and the rear surface of the semiconductor substrate 141 also serve as a hole charge accumulation region for suppressing a dark current.

The upper surface of the semiconductor substrate 141 which is on the upper side in FIG. 6 is the rear surface of the semiconductor substrate 141 and is a light incident surface on which light is incident. An anti-reflection film 143 is formed on the upper surface of the semiconductor substrate 141 on the rear surface side.

The anti-reflection film 143 has a laminated structure in which a fixed charge film and an oxide film are laminated, and for example, it is possible to use an insulating thin film with a high dielectric constant (high-k) obtained by an atomic layer deposition (ALD) method. Specifically, it is possible to use hafnium oxide (HfO2), aluminum oxide (Al2O3), titanium oxide (TiO2), strontium titan oxide (STO), or the like. In the example of FIG. 6, the anti-reflection film 143 is configured such that a hafnium oxide film 153, an aluminum oxide film 154, and a silicon oxide film 155 are laminated.

An inter-pixel light shielding film 145 that prevents incident light from being incident on adjacent pixels is formed at a boundary portion 144 of the adjacent pixels 31 (hereinafter, also referred to as a pixel boundary portion 144) on the semiconductor substrate 141 on the upper surface of the anti-reflection film 143. It is only necessary for a material of the inter-pixel light shielding film 145 to be a material that shields light, and for example, it is possible to use a metal material such as tungsten (W), aluminum (Al), or copper (Cu).

A flattening film 146 is formed of insulating film of silicon oxide (SiO2), silicon nitride (SiN), silicon oxynitride (SiON) or the like or an organic material such as a resin on the upper surface of the anti-reflection film 143 and the upper surface of the inter-pixel light shielding film 145.

Then, an on-chip lens 147 is formed on the upper surface of the flattening film 146 in units of pixels. The on-chip lens 147 is formed of a resin material such as a styrene-based resin, an acrylic-based resin, a styrene-acrylic copolymer resin, or a siloxane-based resin, for example. Light collected by the on-chip lens 147 is efficiently incident on the PD 51.

In addition, an inter-pixel separation portion 161 that separates adjacent pixels is formed from the rear surface side (the side of the on-chip lens 147) of the semiconductor substrate 141 to a predetermined depth in a substrate depth direction at the pixel boundary portion 144 on the rear surface side of the semiconductor substrate 141. An outer circumference portion including a bottom surface and a side wall of the inter-pixel separation portion 161 is covered with the hafnium oxide film 153 which is a portion of the anti-reflection film 143. The inter-pixel separation portion 161 prevents incident light from penetrating through the next pixel 31 to confine the incident light in its own pixel, and prevents leakage of incident light from the adjacent pixels 31.

In the example of FIG. 6, the silicon oxide film 155 and the inter-pixel separation portion 161 are formed at the same time by embedding the silicon oxide film 155, which is a material of an uppermost layer of the anti-reflection film 143, in a trench (groove) dug from the rear surface side, and thus the silicon oxide film 155 which is a portion of the laminated film as the anti-reflection film 143 and the inter-pixel separation portion 161 are formed of the same material but their materials do not necessarily need to be the same. The material embedded in the trench (groove) dug from the rear surface side as the inter-pixel separation portion 161 may be a metal material such as tungsten (W), aluminum (Al), titanium (Ti), or titanium nitride (TiN).

On the other hand, the two transfer transistors TRG1 and TRG2 are formed for one PD 51 formed in each pixel 31 on the side of the front surface of the semiconductor substrate 141 where the multi-layer wiring layer 142 is formed. For example, the transfer transistor TRG1 corresponds to the TG 41A (FIG. 5) while the transfer transistor TRG2 corresponds to the TG 41B (FIG. 5).

Also, floating diffusion regions FD1 and FD2 that serve as charge accumulation units that temporarily hold charge transferred from the PD 51 are formed by high-concentration N-type semiconductor regions (N-type diffusion regions) on the side of the front surface of the semiconductor substrate 141. For example, the floating diffusion region FD1 corresponds to (the FD 42A-1 or the FD 42A-2 (FIG. 5) configuring) the FD 42A while the floating diffusion region FD2 corresponds to (the FD 42B-1 or the FD 42B-2 (FIG. 5) configuring) the FD 42B.

The multi-layer wiring layer 142 is configured by a plurality of wiring layers M and inter-layer insulating films 162 therebetween. FIG. 6 illustrates an example in which the multi-layer wiring layer 142 is configured by four layers, namely wiring layers M1 to M4.

Wirings 171 to 174 are formed in each of the plurality of wiring layers M in the multi-layer wiring layer 142. The wirings 171 to 174 are formed of metal films of copper (Cu), aluminum (Al), tungsten (W), titanium (Ti), or titanium nitride (TiN), for example. Here, the wiring disposed in the wiring layer M1 is assumed to be the wiring 171, the wiring disposed in the wiring layer M2 is assumed to be the wiring 172, the wiring disposed in the wiring layer M3 is assumed to be the wiring 173, and the wiring disposed in the wiring layer M4 is assumed to be the wiring 174.

The wirings 171 to 174 disposed in the wiring layers M1 to M4 are connected at necessary locations with a via 166 provided in the vertical direction.

As described above, the pixel 31 has a rear-surface irradiation-type structure in which the semiconductor substrate 141 that is a semiconductor layer is disposed between the on-chip lens 147 and the multi-layer wiring layer 142 and incident light is caused to be incident on the PD 51 from the side of the rear surface on which the on-chip lens 147 is formed.

Also, the pixel 31 includes the two transfer transistors TRG1 and TRG2 for the PD 51 provided in each pixel and is configured to be able to allocate charge (electrons) generated by the PD 51 through photoelectric conversion to the floating diffusion region FD1 or FD2.

<Concerning Method for Calculating Depth Value>

A method for calculating a depth value from a signal obtained by a pixel including the aforementioned two taps will be described. As schemes for calculating a depth value, there is a two-phase scheme using detection signals in two types of phases and a four-phase scheme using detection signals in four types of phases.

The two-phase scheme and the four-phase scheme will be described.

Figure 7:
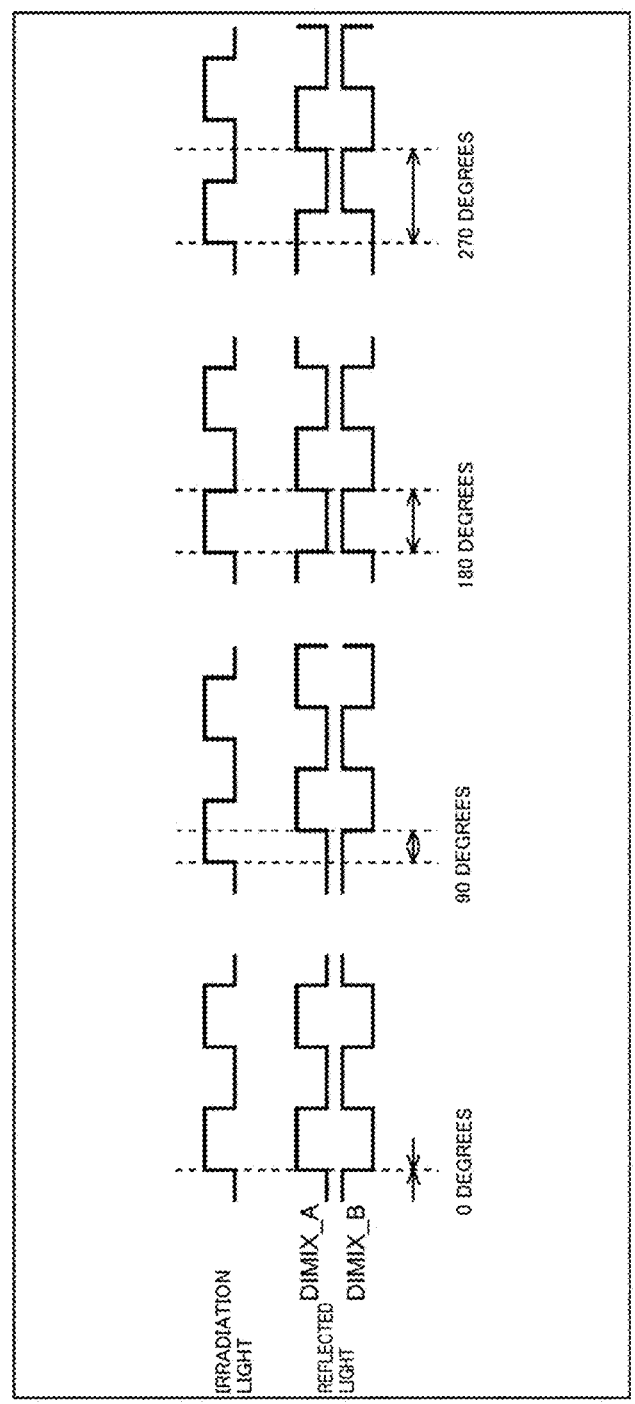
FIG. 7 is a diagram for explaining a two-phase scheme and a four-phase scheme.

In the four-phase scheme, the light receiving unit 15 receives reflected light at a light receiving timing obtained by shifting a phase by 0°, 90°, 180°, and 270° with reference to an irradiation timing of irradiation light as illustrated in FIG. 7. More specifically, the light receiving unit 15 receives reflected light by changing the phase in a time division manner, and for example, the light receiving unit 15 receives reflected light while setting the phase at 0° with respect to the irradiation timing of the irradiation light in a certain frame period, receives light while setting the phase at 90° in the next frame period, receives light while setting the phase at 180° in the next frame period, and receives light while setting the phase at 270° in the next frame period.

Note that the phase at 0°, 90°, 180°, or 270° represents the phase in the tap 52A of the pixel 31 unless particularly indicated otherwise. Since the tap 52B has a phase inverted from the one of the tap 52A, the tap 52B has a phase at 180°, 270°, 0°, or 90° when the tap 52A has a phase at 0°, 90°, 180°, or 270°.

Figure 8:
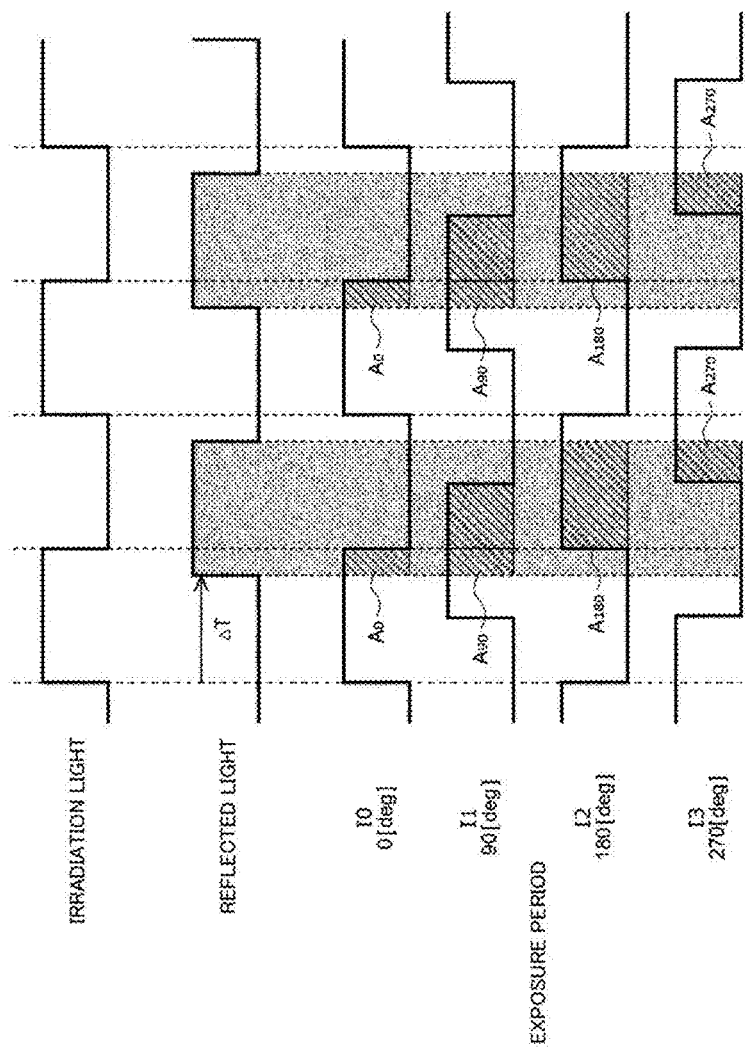
FIG. 8 is a diagram for explaining the two-phase scheme and the four-phase scheme.

FIG. 8 is a diagram illustrating exposure periods of the tap 52A of the pixel 31 in the phases at 0°, 90°, 180°, and 270° aligned for easy understanding of phase differences.

As illustrated in FIG. 8, a detection signal A obtained by receiving light in the same phase (the phase at) 0° as that of the irradiation light will be referred to as a detection signal A0, a detection signal A obtained by receiving light in the phase (the phase at) 90° obtained by shifting the phase from that of the irradiation light by 90 degrees will be referred to as a detection signal A90, a detection signal A obtained by receiving light in the phase (the phase at 180°) obtained by shifting the phase from that of the irradiation light by 180 degrees will be referred to as a detection signal A180, and a detection signal A obtained by receiving light in the phase (the phase at) 270° obtained by shifting the phase from that of the irradiation light by 270 degrees will be referred to as a detection signal A270, in the tap 52A.

Although not illustrated, a detection signal B obtained by receiving light in the same phase (the phase at) 0° as that of the irradiation light will be referred to as a detection signal B0, a detection signal B obtained by receiving light in the phase (the phase at) 90° by shifting the phase from that of the irradiation light by 90 degrees will be referred to as a detection signal B90, a detection signal B obtained by receiving light in the phase (the phase at 180°) by shifting the phase from that of the irradiation light by 180 degrees will be referred to as a detection signal B180, and a detection signal B obtained by receiving light in the phase (the phase at) 270° obtained by shifting the phase from that of the irradiation light by 270 degrees will be referred to as a detection signal B270, in the tap 52B.

Figure 9:
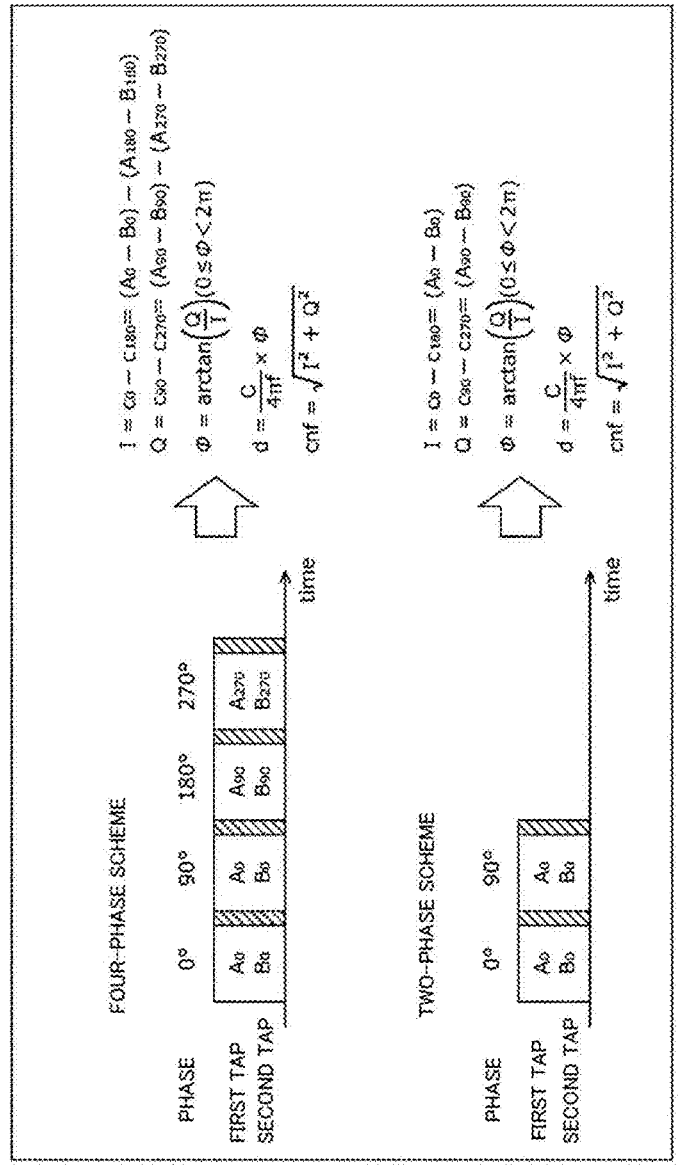
FIG. 9 is a diagram for explaining the two-phase scheme and the four-phase scheme.

FIG. 9 is a diagram for explaining a method for calculating a depth value and reliability in the two-phase scheme and the four-phase scheme.

In the indirect ToF method, a depth value d can be obtained by the following Expression (1).

[Math. 1]
$$d = \frac{c \cdot \Delta T}{2} = \frac{c \cdot \phi}{4\pi f} \tag{1}$$

In Expression (1), c is the speed of light, $\Delta T$ is a delay time, and f represents a modulation frequency of light. Further, $\varphi$ in Expression (1) represents a phase shift amount [rad] of reflected light and is represented by the following Expression (2).

[Math. 2]
$$\phi = \arctan\left(\frac{Q}{I}\right) (0 \le \phi < 2\pi) \tag{2}$$

In the four-phase scheme, I and Q in Expression (2) are calculated by the following Expression (3) using the detection signals A0 to A270 and the detection signals B0 to B270 obtained by setting the phase at 0°, 90°, 180°, and 270°. I and Q are signals obtained by converting a phase of a sine wave from polar coordinates to an orthogonal coordinate system (IQ plane) on the assumption that a luminance change of irradiation light is a sine wave.

$$I = c0 - c180 = (A0 - B0) - (A180 - B180)$$

$$Q = c90 - c270 = (A90 - B90) - (A270 - B270) \tag{3}$$

In the four-phase scheme, it is possible to remove variations in properties between the taps, that is, a difference in sensitivity between the taps that are present in each pixel by acquiring a difference in detection signals in opposite phases in the same pixel by "A0-A180" and "A90-A270" in Expression (3), for example.

On the other hand, in the two-phase scheme, it is possible to calculate I and Q in Expression (2) using detection signals in two phases, namely the phase at 0° and the phase at 90°. In other words, I and Q in Expression (2) in the two-phase scheme are expressed by the following Expression (4).

$$I = c0 - c180 = (A0 - B0)$$

$$Q = c90 - c270 = (A90 - B90) \tag{4}$$

In the two-phase scheme, although it is not possible to remove variations in properties between the taps that are present in each pixels, it is possible to obtain the depth value d up to an object using only detection signals in two phases and thereby to perform distance measurement at a frame rate that is a double the frame rate in the four-phase scheme. The variations in properties between the taps can be adjusted by a correction parameter such as a gain or an offset, for example.

Reliability cnf can be obtained by the following Expression (5) in both the two-phase scheme and the four-phase scheme.

[Math. 3]
$$cnf = \sqrt{I^2 + Q^2} \tag{5}$$

As can be recognized from Expression (5), the reliability cnf corresponds to how large the reflected light that has been received by the pixel 31 is, that is, luminance information (luminance value).

Note that a unit in which each pixel 31 in the pixel array unit 32 outputs pixel data (detection signal) in one phase at 0°, 90°, 180°, 270°, or the like will be referred to as one frame (period) below. One depth map is generated in four frames constituted by four phases in the four-phase scheme, while one depth map is generated in two frames constituted by two phases in the case of the two-phase scheme.

<Problems in all-Pixel Simultaneous Driving>

If the aforementioned basic pixel driving is performed at the same timing for all the pixels 31 in the pixel array unit 32, the following problems may occur.

(1) Occurrence of IR Drop

The drive control circuit 33 performs control for allocating the charge generated by the photodiode 51 to the tap 52A or the tap 52B in accordance with allocation signals DIMIX_A and DIMIX_B. If all the pixels 31 in the pixel array unit 32 are driven at the same timing in a case in which the number of pixels in the pixel array unit 32 is large, a drive current concentrates, strong charged and discharging current ma cause an IR drop, the allocation signals DIMIX_A and DIMIX_B become distorted signals, and a situation in which allocation of charge cannot accurately be controlled may occur. In a case in which the number of pixels (resolution) in the pixel array unit 32 is larger than VGA of 640×480, for example, and if all the pixels in the pixel array unit 32 are driven at the same time, an IR drop has large influences.

(2) Degradation of EMC/EMI

If all the pixels 31 in the pixel array unit 32 are driven at the same timing, a peak current increases, an electromagnetic wave generated from the distance measurement sensor 13 also increases, and electromagnetic compatibility (EMC) and electromagnetic interference (EMI) are degraded.

Therefore, it is desirable to perform such drive that the driving of all the pixels in the pixel array unit 32 is dispersed to disperse the peak current.

(3) Occurrence of Cyclic Error

As described above, although the depth value d is calculated on the assumption that a change in luminance of the irradiation light is a sine wave, light actually emitted from the light emitting unit 12 is a rectangular wave as illustrated in FIG. 3, and a periodical error (hereinafter, referred to as a cyclic error) occurs in the depth value d by processing the rectangular wave as a sine wave.

The light receiving unit 15 according to the present disclosure realizes driving of causing driving of all the pixels in the pixel array unit 32 to be dispersed, causing the peak current to be dispersed, and thereby reducing the cyclic error. Hereinafter, driving of the light receiving unit 15 will be described in detail.

<Detailed Configuration Example of Light Receiving Unit>
<Example in which Number of Phase Control Splits is Two>

Figure 10:
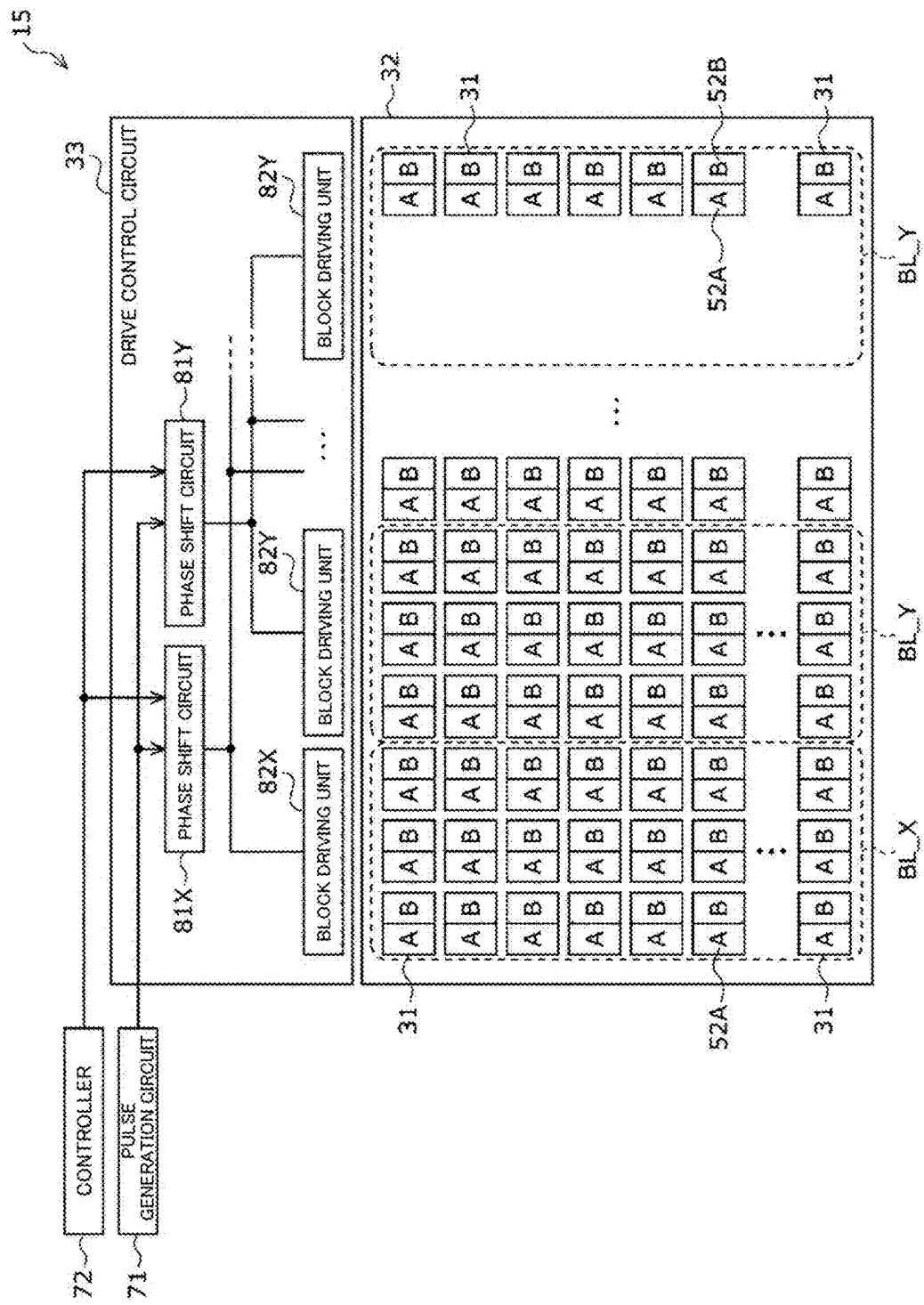
FIG. 10 is a block diagram illustrating a more detailed configuration example of the light receiving unit.

FIG. 10 is a block diagram illustrating a more detailed configuration example of the light receiving unit 15.

The light receiving unit 15 includes the pixel array unit 32 in which the pixels 31 are two-dimensionally arranged and the drive control circuit 33 as described in FIG. 2. Note that in FIG. 10, the tap 52A and the tap 52B of the pixel 31 illustrated in FIG. 2 are illustrated in a simplified manner as "A" and "B".

In the pixel array unit 32, N(N>1) pixel arrays are defined as one block BL and all the pixels 31 two-dimensionally arranged are split into a plurality of blocks BL. As the example in FIG. 10, an example in which N=3 and three pixel arrays are defined as one block BL is illustrated.

Each block BL in the pixel array unit 32 is further categorized into any of units for controlling two types of phases (phase control unit block). If each of the two types of phase control unit blocks is defined as a block BL_X or a block BL_Y, the block BL_X and the block BL_Y are alternately arranged in the horizontal direction (row direction) as illustrated in FIG. 10.

The light receiving unit 15 further includes a pulse generation circuit 71 and a controller (control circuit) 72 in addition to the pixel array unit 32 and the drive control circuit 33.

The drive control circuit 33 includes two phase shift circuits 81 and two or more block driving units 82. Note that both or one of the pulse generation circuit 71 and the controller 72 may be configured as a part of the drive control circuit 33.

In FIG. 10, the phase shift circuit 81 corresponding to the block BL_X is represented as a phase shift circuit 81X, and the phase shift circuit 81 corresponding to the block BL_Y is represented as a phase shift circuit 81Y, out of the two phase shift circuits 81. Similarly, the block driving unit 82 corresponding to the block BL_X is represented as a block driving unit 82X, and the block driving unit 82 corresponding to the block BL_Y is represented as a block driving unit 82Y, out of the two or more block driving units 82.

The pulse generation circuit 71 generates a drive pulse signal on the basis of a light emission control signal at a predetermined frequency (200 MHz, for example) supplied from the light emission control unit 14 and supplies the drive pulse signal to the phase shift circuits 81X and 81Y.

More specifically, the pulse generation circuit 71 generates a drive pulse signal in frequency synchronization with the light emission control signal from the light emission control unit 14. Also, the pulse generation circuit 71 performs phase shifting with reference to the irradiation timing of irradiation light, which has been described in FIG. 10, on the drive pulse signal after the frequency synchronization and supplies the drive pulse signal to the phase shift circuits 81X and 81Y. The drive pulse signal output from the pulse generation circuit 71 corresponds to the allocation signals DIMIX_A and DIMIX_B described in FIG. 7 and the like.

The controller 72 controls a phase change timing of the phase shift circuits 81X and 81Y. In other words, the controller 72 provides an instruction regarding the timing at which the phase is to be changed to the phase shift circuits 81X and 81Y.

The phase shift circuits 81X and 81Y perform processing of shifting the phase as needed on the drive pulse signal supplied from the pulse generation circuit 71 and supply the drive pulse signal after the phase shifting (phase shift drive pulse signal) to the block driving unit 82. The phase shift circuits 81X and 81Y approximate the irradiation light emitted as a rectangular wave to a sine wave (create a pseudo sine wave) by generating a drive pulse signal shifted to a plurality of phases in a time division manner within one frame period.

Specifically, the phase shift circuits 81X and 81Y performs processing of shifting the phase by 0°, 45°, or 90° within one frame period on the drive pulse signal supplied from the pulse generation circuit 71 in a predetermined order and supply the drive pulse signal after the shifting to the block driving unit 82. Note that in the case of shifting by 0°, the drive pulse signal supplied from the pulse generation circuit 71 may be supplied to the block driving unit 82 as it is.

An instruction regarding the timing at which the phase to be shifted is changed is individually provided from the controller 72 to the phase shift circuits 81X and 81Y. The phase shift circuits 81X and 81Y change the phase to be shifted at the timing indicated by the instruction from the controller 72.

The block driving unit 82X performs control of supplying the drive pulse signal supplied from the phase shift circuit 81X, that is, the allocation signals DIMIX_A and DIMIX_B after the phase shifting to each pixel 31 in the corresponding block BL_X and allocating charge generated by the photodiode 51 to the tap 52A or the tap 52B.

The block driving unit 82Y performs control of supplying the drive pulse signal supplied from the phase shift circuit 81Y, that is, the allocation signals DIMIX_A and DIMIX_B after the phase shifting to each pixel 31 in the corresponding block BL_Y and allocating the charge generated by the photodiode 51 to the tap 52A or the tap 52B.

Figure 11:
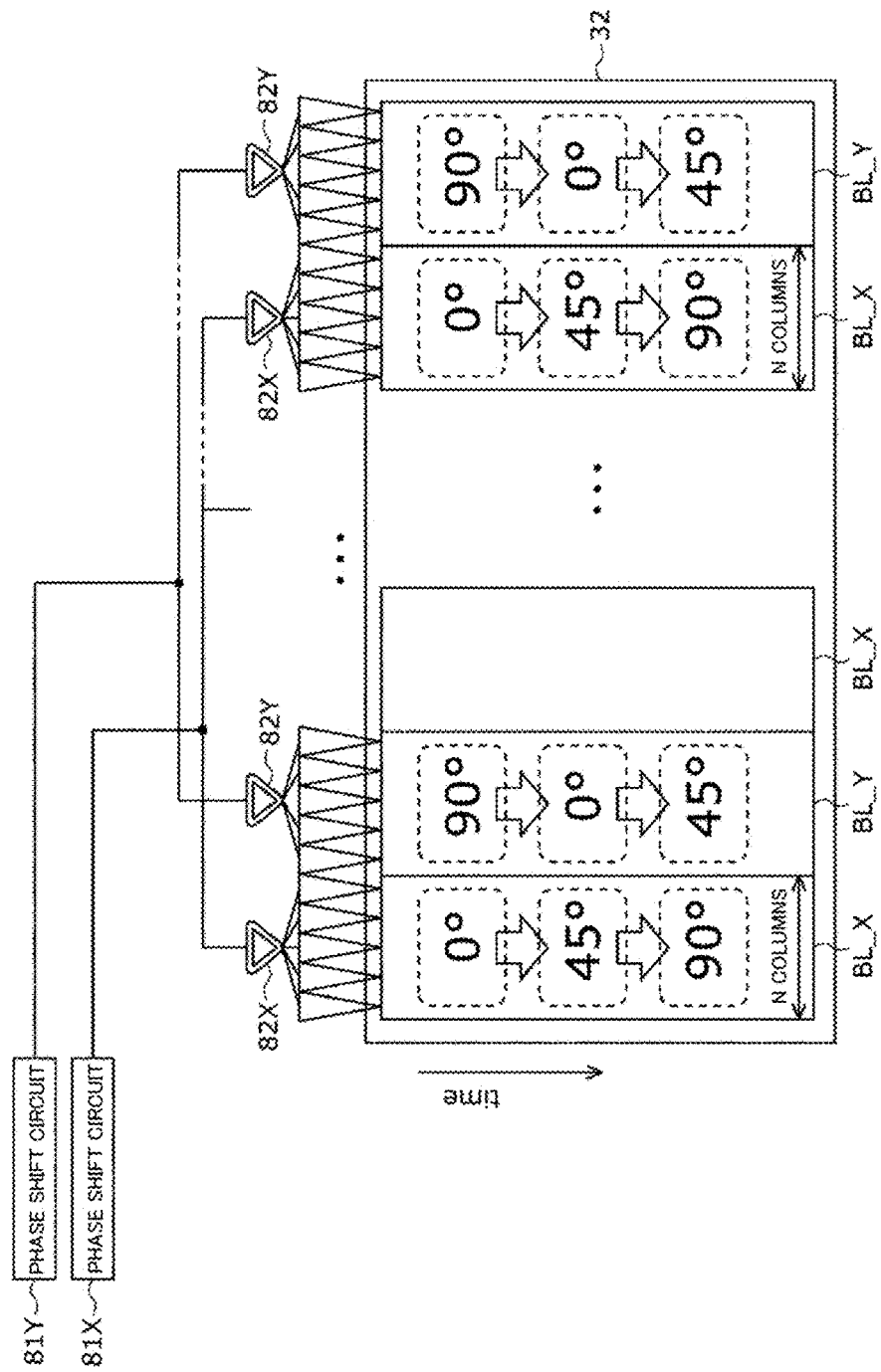
FIG. 11 is a diagram for explaining phase shift processing.

FIG. 11 is a diagram for explaining phase shift processing performed each of the phase shift circuits 81X and 81Y.

The vertical direction of the blocks BL_X and BL_Y in FIG. 11 represents a time axis in one frame period.

The phase shift circuit 81X begins with the phase at 0°, follows the timing indicated by the controller 72, and shifts and outputs the phase in the order of 45° and 90° every time a predetermined time elapses. After the phase at 90°, the processing returns to the phase at 0°, and the phase shift processing is repeated in the order of 0°, 45°, and 90° until exposure ends.

On the other hand, the phase shift circuit 81Y beings with the phase at 90°, follows the timing indicated by the instruction from the controller 72, and shifts and outputs the phase in the order of 0° and 45° every time a predetermined time elapses. After the phase at 45°, the processing returns to the phase at 90°, and the phase shift processing is repeated in the order of 90°, 0°, and 45° until exposure ends.

Figure 12:
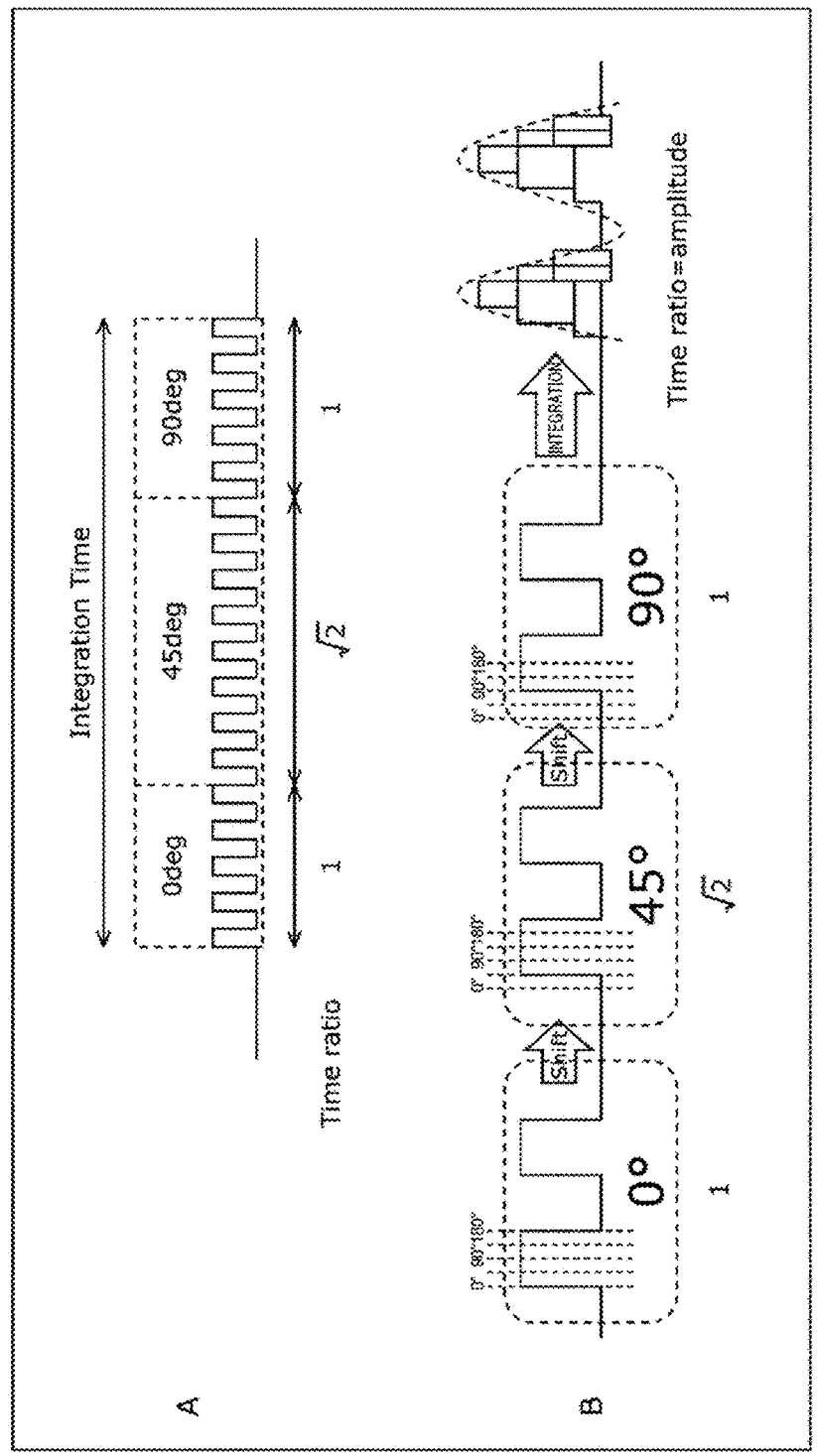
FIG. 12 is a diagram for explaining a charge accumulation time of each phase.

FIG. 12 illustrates a charge accumulation time (integration time) in each phase at 0°, 45°, and 90°.

The controller 72 provides an instruction for changing the phase to the phase shift circuit 81 at a timing at which a ratio of a period during which the phase shift circuit 81 generates a drive pulse signal of shifting the phase at 0°, a period during which the drive pulse signal of shifting the phase at 45° is generated, and a period during which the drive pulse signal of shifting the phase at 90° is generated becomes 1:12:1, as illustrated in A of FIG. 12. In this manner, the ratio of the charge accumulation times in the phases at 0°, 45°, and 90° becomes 1:12:1.

It is possible to approximate the waveform of the modulated wave to a sine wave as illustrated in B of FIG. 12 by setting the ratio of the charge accumulation time in the phases at 0°, 45°, and 90° to be 1:12:1. It is possible to adjust the amplification of the sine wave by adjusting the ratio of the charge accumulation times.

In order to approximate the light with the rectangular waveform output from the light emitting unit 12 to the sine wave, phase shift of the light emission timing of the light source may be performed to create a pseudo sine wave as disclosed in PTL 1, or it is also possible to produce a pseudo sine wave by performing phase shifting of the light receiving timing on the light reception side as in FIG. 12.

Figure 13:
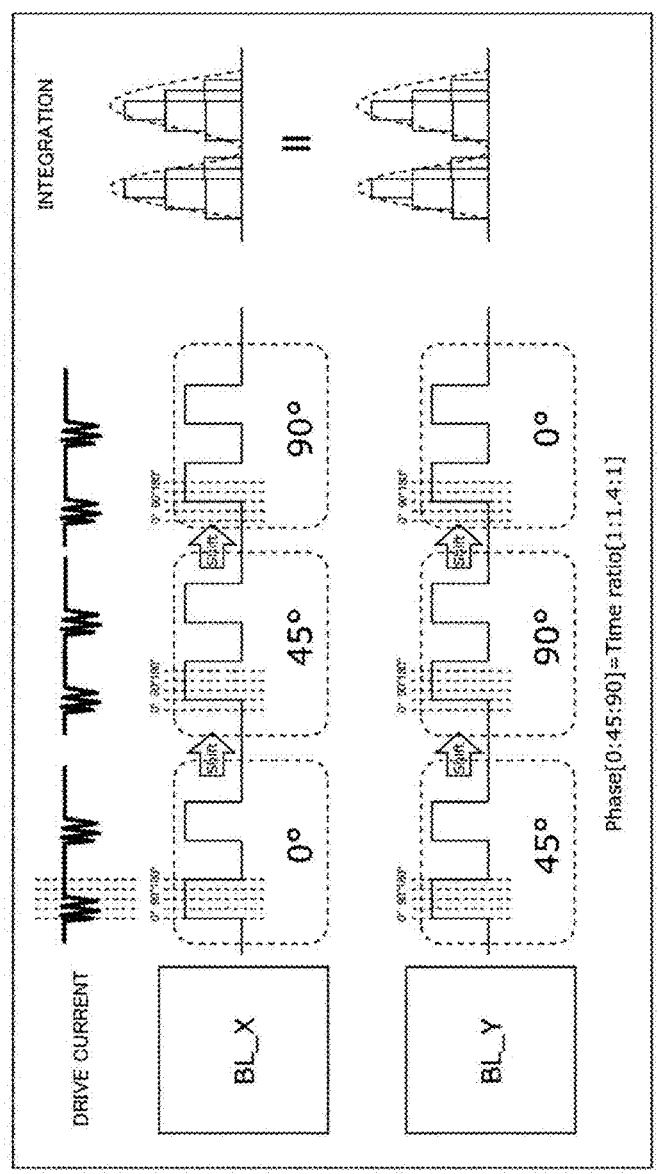
FIG. 13 is a diagram for explaining phase shift control of each block.

FIG. 13 illustrates phase shift control of each of the block BL_X and the block BL_Y.

The drive control circuit 33 categorizes all the pixels in the pixel array unit 32 into the two phase control unit blocks, namely the block BL_X and the block BL_Y, and causes the block BL_X and the block BL_Y to accumulate charge in different phases as illustrate in FIG. 13. In this manner, the current for driving the pixels 31 are dispersed in the entire pixel array unit 32, and it is thus possible to curb a decrease in IR drop and also to curb degradation of EMC and EMI.

Also, the phase shift circuit 81 can approximate the modulated wave of the received light to a sine wave and reduce a cyclic error by controlling the ratio of the charge accumulation times of the phases at 0°, 45°, and 90° to 1:12:1 on the basis of the timing control performed by the controller 72.

Since integration results of the pixels disposed in the block BL_X and the block BL_Y are the same, pixel data (the detection signals A and B) output from the pixels do not require any special correction processing such as correction processing of canceling an offset or the like in the plane (in the area) of the pixel array unit 32.

Thus, according to the distance measurement sensor 13, it is possible to realize driving for achieving both reduction of a cyclic error and dispersion of a drive current. Also, it is possible to acquire pixel data (the detection signals A and B) similar to that in a case in which phase shifting is not performed.

<Detection Based on IQ Mosaic>

The effects of dispersing a drive current and reducing a cyclic error occur through phase shifting for creating a pseudo sine wave performed by the plurality of phase shift circuits 81 and the plurality of block driving units 82 and the drive timing dispersion in units of blocks as described above.

However, in order for the distance measurement sensor 13 to output one depth map, four frames are needed in the four-phase scheme, and two frames are needed in the two-phase scheme as described above. If the number of pixels in the distance measurement sensor 13 increases, there is a concern that a frame rate may be degraded.

Driving of outputting one depth map in one frame by modifying the two-phase scheme will be described with reference to FIG. 14.

Figure 14:
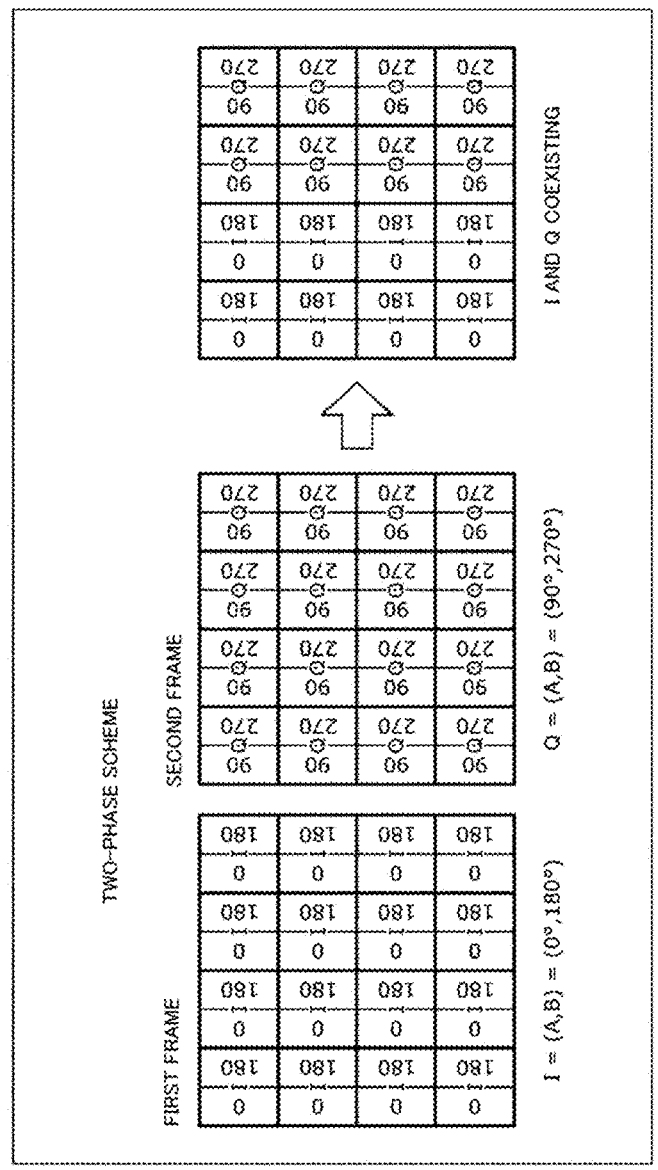
FIG. 14 is a diagram for explaining IQ mosaic drive.

In the two-phase scheme, the tap 52A of each pixel 31 acquires a detection signal in the phase at 0°, and the tap 52B acquires a detection signal in the phase at 180°, in the first frame as illustrated on the left side in FIG. 14. Next, the tap 52A of each pixel 31 acquires a detection signal in the phase at 90°, and the tap 52B acquires a detection signal in the phase at 270°, in the second frame. Then, I and Q in Expression (4) and the depth value d in Expression (1) are calculated using the four detection signals in the first frame and the second frame.

If it is assumed that the pixel data of each pixel 31 obtained in the first frame is referred to as I pixel data of the same phase component as the modulated wave of light and the pixel data of each pixel 31 obtained in the second frame is referred to as Q pixel data of the orthogonal phase component with respect to the modulated wave of the light, the I pixel data is acquired by all the pixels in the first frame, and the Q pixel data is acquired by all the pixels in the second frame, in the two-phase scheme.

On the other hand, it is possible to acquire detection signals in all the phases at 0°, 90°, 180°, and 270° in one frame for the modulated wave of the light by causing the pixels 31 that acquire the I pixel data (hereinafter, referred to as I pixels) and the pixels 31 that acquire the Q pixel data (hereinafter, referred to as Q pixels) to be present together as illustrated on the right side in FIG. 14, thereby to calculate I and Q in Expression (4), and to obtain the depth value d. In this manner, the drive of causing the I pixels and the Q pixels to be present together in one frame will be referred to as IQ mosaic driving.

In the IQ mosaic driving illustrated in FIG. 14, driving is performed such that the I pixel, the I pixel, the Q pixel, and the Q pixel are aligned in this order in the horizontal direction (row direction) in the drawing. Although the following description will be continued by exemplifying the case in which driving is performed such that the I pixel, the I pixel, the Q pixel, and the Q pixel are aligned in this order, the present technique can also be applied to a case in which driving is performed in other alignment, for example, alignment in the order of the I pixel, the Q pixel, the I pixel, and the Q pixel.

Note that in the IQ mosaic driving in FIG. 14, it is not possible to remove variations in properties between the taps that are present in each pixel similarly to the aforementioned two-phase scheme.

Figure 15:
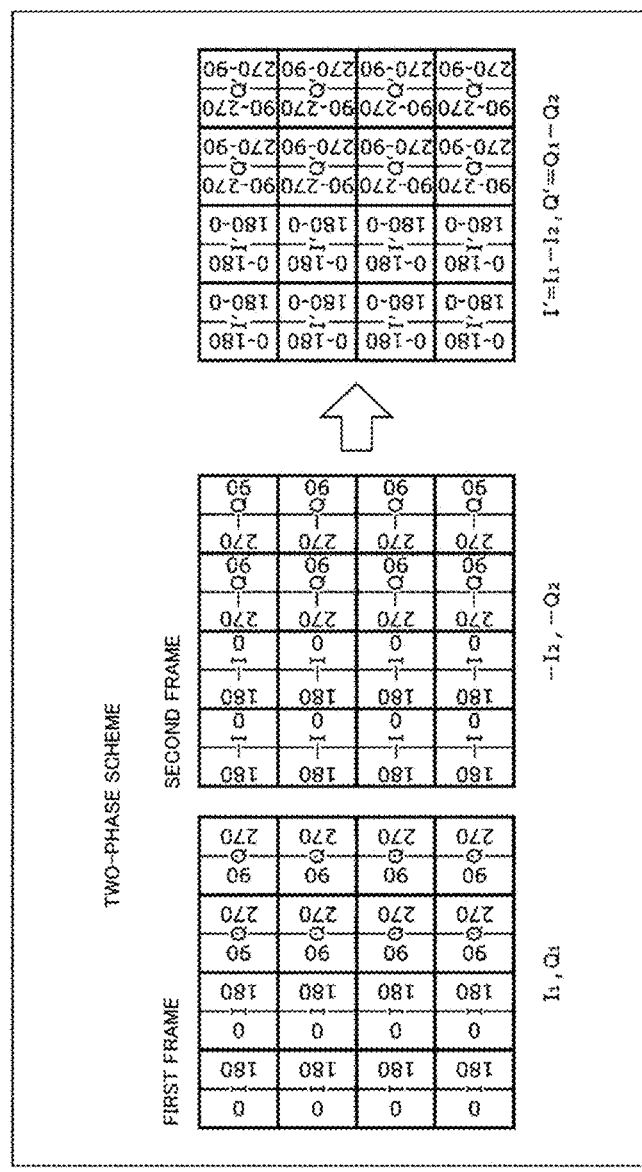
FIG. 15 is a diagram for explaining the IQ mosaic drive.

In a case in which priority is placed on removing of variations in properties between the taps that are present in each pixel, the drive control circuit 33 performs driving similar to the IQ mosaic driving in one frame in FIG. 14 in the first frame and performs IQ mosaic driving with the phases of the tap 52A and the tap 52B of each pixel 31 inverted from those of the first frame in the second frame, as illustrated in FIG. 15. In this case, it is possible to remove variations in properties between the taps that are present in each pixel similarly to the aforementioned four-phase scheme by obtaining a difference in detection signals in opposite phases within the same pixel using the pixel data in the first frame and the second frame and to obtain the depth value d with the smaller number of frames (two frames) than that in the four-phase scheme.

As a measure for reducing a frame rate with an increase in the number of pixels in the pixel array unit 32, it is possible to employ the aforementioned IQ mosaic driving.

By combining the IQ mosaic driving, the phase shifting for producing a pseudo sine wave performed by the plurality of phase shift circuits 81 and the plurality of block driving units 82, and the drive timing dispersion in units of blocks BL, it is possible to obtain the effect of shortening the frame rate and the effect of dispersing a drive current and reducing a cyclic error at the same time.

<Example of IQ Mosaic Driving in which Number of Phase Control Splits is Four>

Next, IQ mosaic driving in which all the pixels in the pixel array unit 32 are categorized into four types of phase control unit blocks and the I pixels and the Q pixels are arranged in units of pixel arrays as in FIG. 14 will be described.

Figure 16:
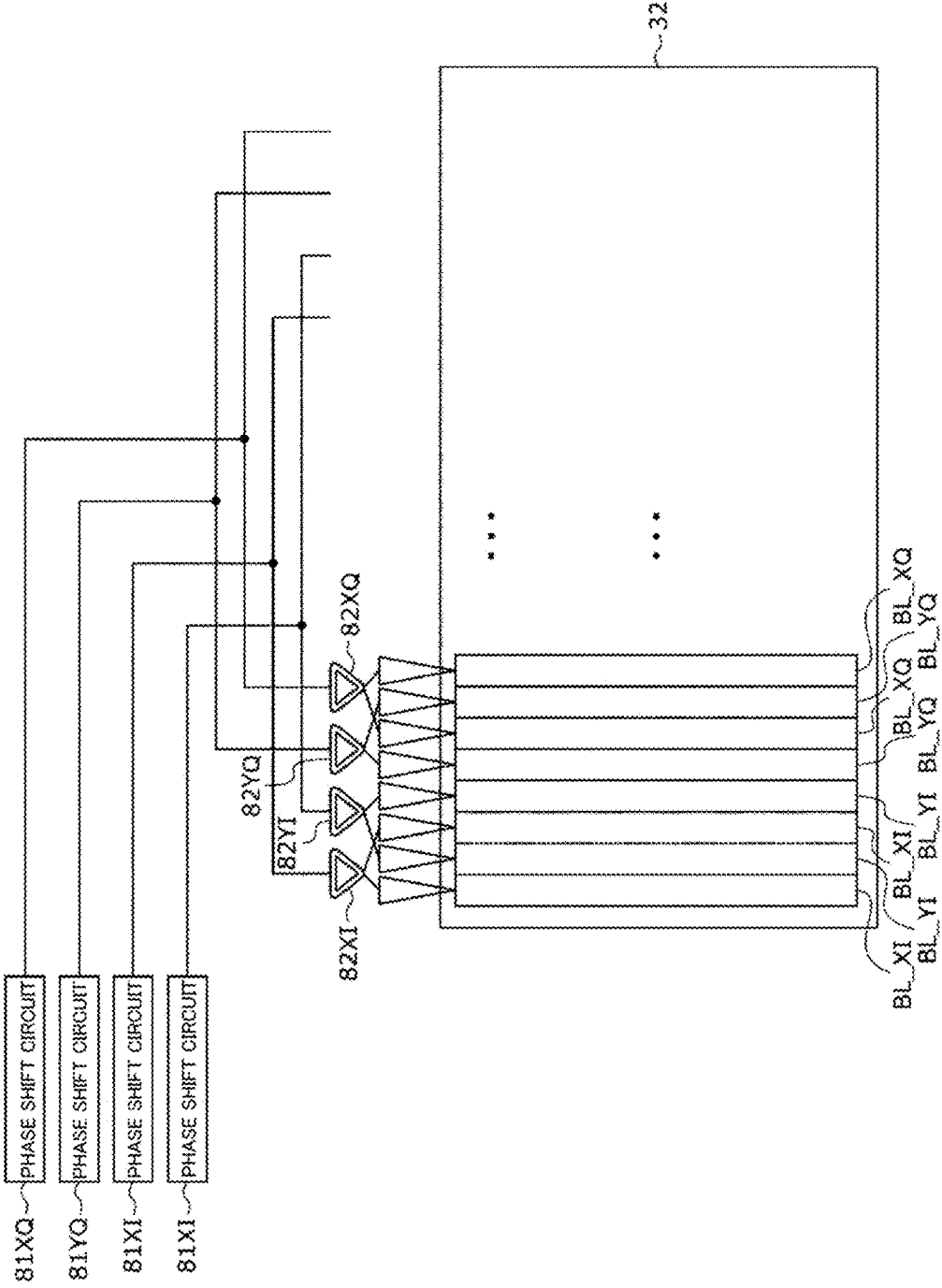
FIG. 16 is a diagram illustrating an example of the IQ mosaic drive in which the number of splits in phase control is four.

FIG. 16 is a diagram illustrating a schematic configuration example of the pixel array unit 32 and the drive control circuit 33 in a case in which the pixel array unit 32 is categorized into four types of phase control unit blocks and the IQ mosaic driving is performed.

Each block BL split in units of N columns in the pixel array unit 32 is categorized into four types, namely a block BL_XI, a block BL_YI, a block BL_XQ, and a block BL_YQ. The blocks BL_XI and BL_YI are blocks BL including the pixels 31 that perform driving as I pixels, and the blocks BL_XQ and BL_YQ are blocks BL including the pixels 31 that perform driving as Q pixels.

The drive control circuit 33 includes four phase shift circuits 81 and four or more block driving units 82.

Out of the four phase shift circuits 81, the phase shift circuits 81 corresponding to the blocks BL_XI, BL_YI, BL_XQ, and BL_YQ will be represented as phase shift circuits 81XI, 81YI, 81XQ, and 81YQ, respectively. Similarly, out of the four or more block driving units 82, the block driving units 82 corresponding to the blocks BL_XI, BL_YI, BL_XQ, and BL_YQ will be represented as block driving units 82XI, 82YI, 82XQ, and 82YQ, respectively.

Figure 17:
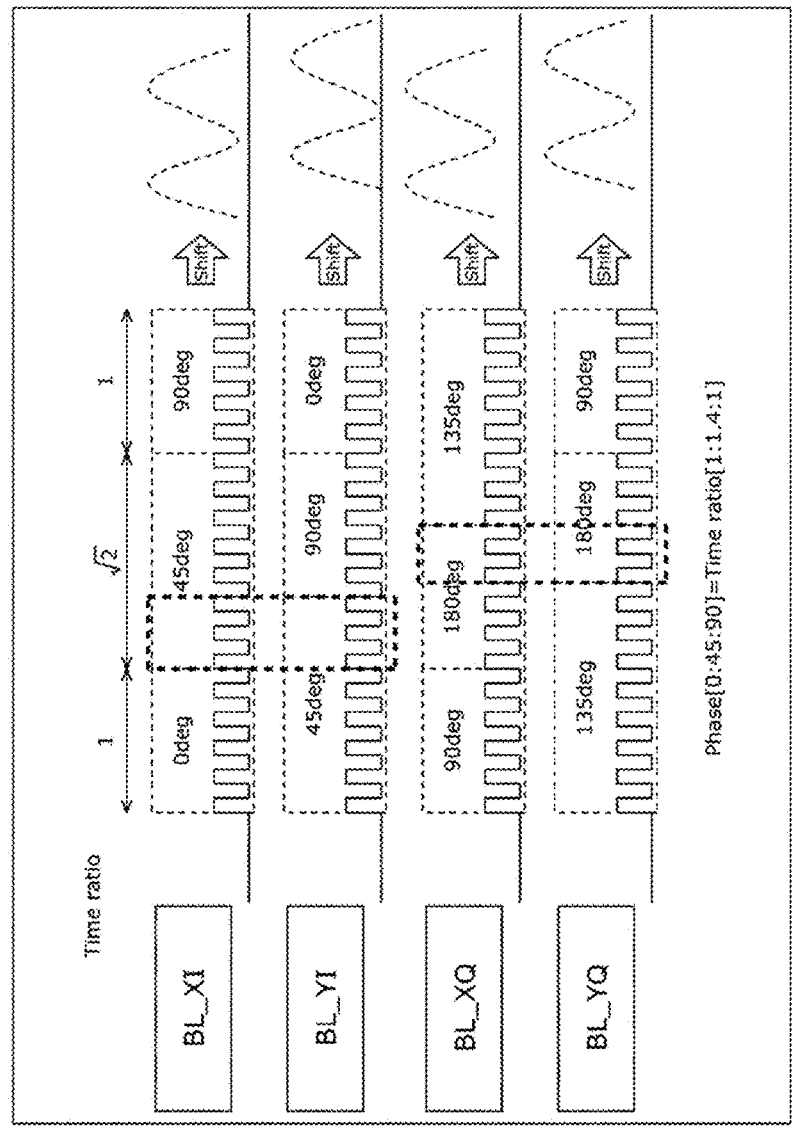
FIG. 17 is a diagram for explaining phase shift control of each block.

FIG. 17 illustrates phase shift control of each of the blocks BL_XI, BL_YI, BL_XQ, and BL_YQ.

The ratio of charge accumulation times in the phases at 0°, 45°, and 90 in each pixel 31 is 1:√2 (≈1.4): 1 similarly to the aforementioned example. In a case in which the phase of the I pixels is 0°, 45°, or 90°, the phase of the Q pixels are 90°, 135°, or 180°, respectively, and the phase of the I pixels and the phase of the Q pixels are in an orthogonal relationship.

As can be recognized from FIG. 17, if it is assumed that the types of the phase shifting for producing a pseudo sine wave are three types, namely 0°, 45°, and 90° (90°, 135°, and 180° for the Q pixels), and the ratio of the charge accumulation times in the phases at 0°, 45°, and 90° is 1:√2 (≈1.4):1, the same phase is obtained in the two blocks BL in a partial period illustrated by the dashed line. In other words, although the phase of each block BL differs except for the partial period illustrated by the dashed line, it is not possible to completely disperse the phases such that the phase of each block BL differs in the entire one frame period.

Figure 18:
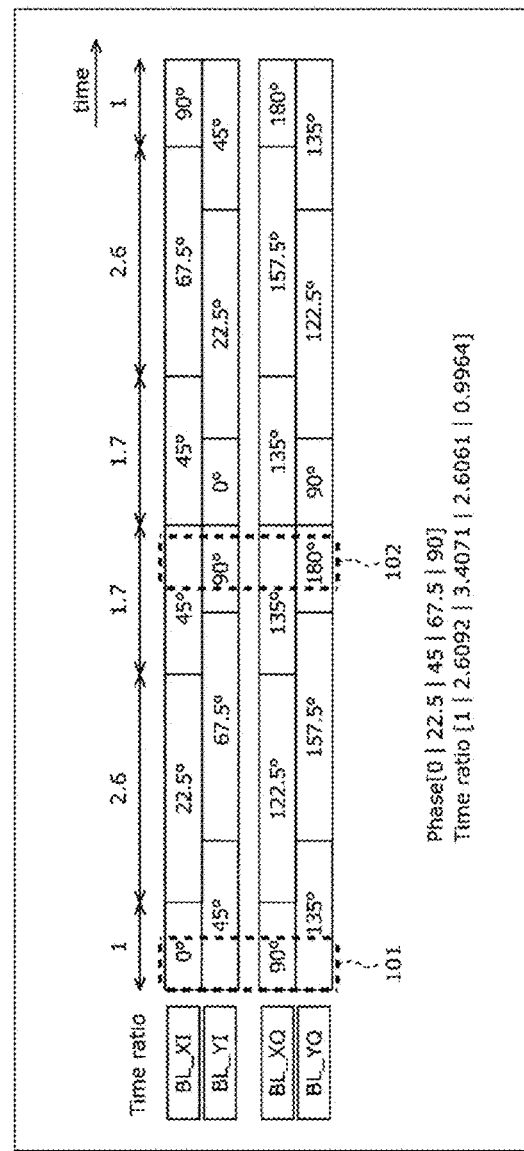
FIG. 18 is a diagram illustrating an example of the IQ mosaic drive in which the number of splits in phase control is four.

Thus, the drive control circuit 33 can completely differentiate the phase of each phase control unit block in the entire one frame period by performing the phase shift control illustrated in FIG. 18.

FIG. 18 is a diagram illustrating a phase shift control example based on IQ mosaic drive in which the pixel array unit 32 is categorized into four types of phase control unit blocks and the phases of the phase control unit blocks are completely differentiated.

The drive control circuit 33 performs the phase shift control by setting the types of the phase shifting for producing a pseudo sine wave to five types, namely 0°, 22.5°, 45°, 67.5°, and 90° at every 22.5° (90°, 112.5°, 135°, 157.5°, and 180° for the Q pixels) and setting the ratio of the charge accumulation times in the phases at 0°, 22.5°, 45°, 67.5°, and 90° to be 1:2.6092:3.4071:2.6061:0.9964.

By performing such control, it is possible to achieve a state in which the phase of each phase control unit block differs in all the periods. For example, the blocks BL_XI, BL_YI, BL_XQ, and BL_YQ are controlled to the phases at 0°, 45°, 90°, and 135° in the period 101 illustrated by the dashed line, and are controlled to the phases at 45°, 90°, 135°, and 180° in the period 102 illustrated by the dashed line.

Figure 19:
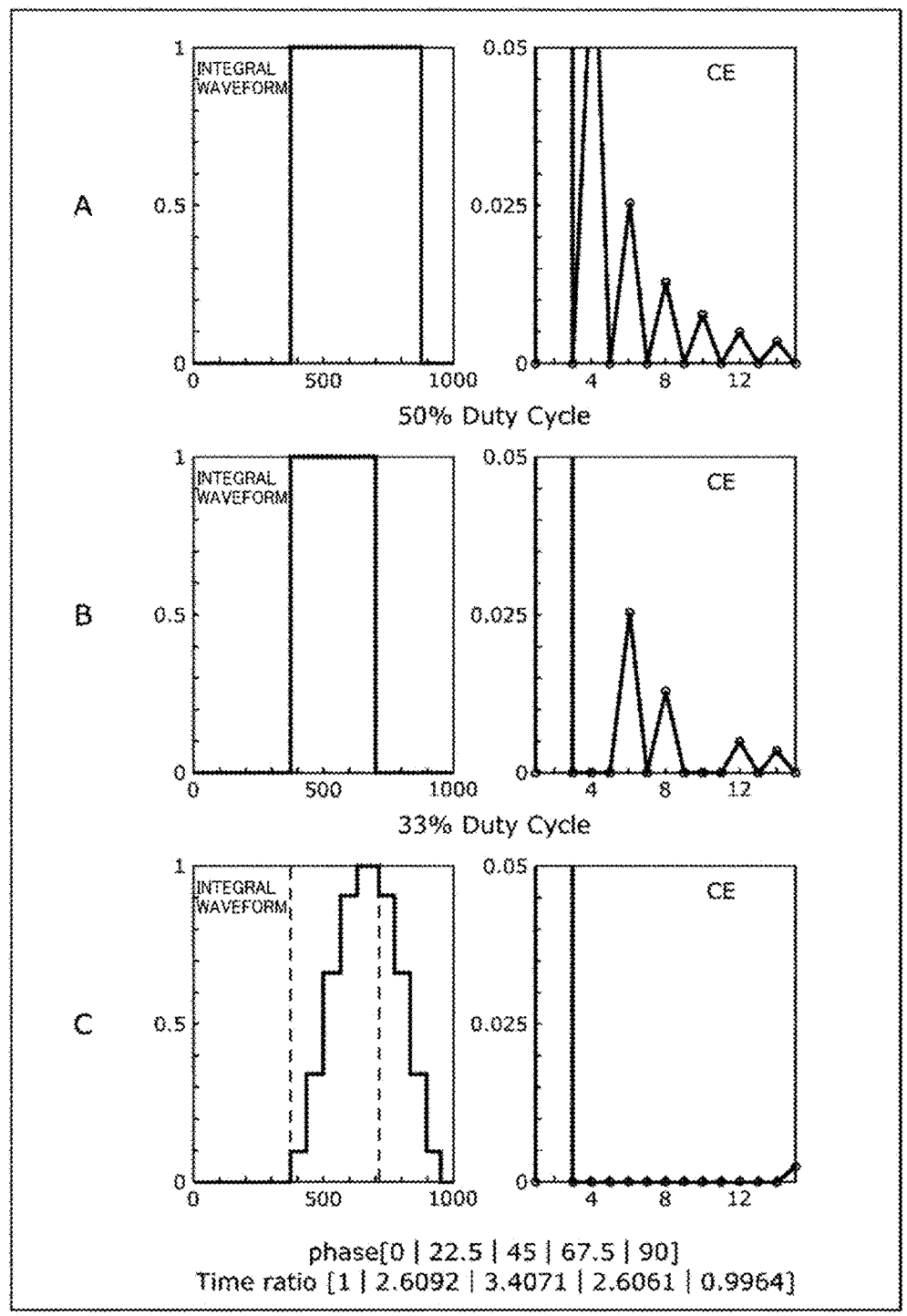
FIG. 19 is a diagram for explaining a cyclic error effect of using pseudo sin.

FIG. 19 is a diagram illustrating a result of comparing cyclic errors between exposure control based on a rectangular pulse and exposure control based on pseudo sine wave illustrated in FIG. 18.

A of FIG. 19 is a graph illustrating a cyclic error (CE) in the exposure control of a rectangular pulse with a duty of 50%, in which the ratio of a high time is 50%.

B of FIG. 19 is a graph illustrating a cyclic error (CE) in the exposure control of a rectangular pulse with a duty of 33% in which the ratio of the high time is 33%.

C of FIG. 19 is a graph illustrating a cyclic error (CE) in the exposure control of a pseudo sine wave illustrated in FIG. 18.

In all of A, B, and C in FIG. 19, the left graphs represent integration waveforms at the time of integration in one frame period, and the right graphs represent cyclic errors (vertical axis) for each frequency (horizontal axis) at FFT.

In the exposure control based on a pseudo sine wave, a cyclic error is substantially zero at frequencies other than 200 MHz, which is a light source modulation frequency, as illustrated in C of FIG. 19. In the graph illustrating a result of FFT, the value obtained by multiplying the integer value on the horizontal axis by 100 corresponds to the frequency. On the other hand, in the exposure control based on the rectangular pulse in A and B of FIG. 19, a cyclic error occurs at frequencies other than 200 MHz, which is a light source modulation frequency, and particularly, the cyclic error increases at frequencies that are integer multiples of 200 MHz.

As described above, according to the exposure control based on a pseudo sine wave illustrated in FIG. 18, it is possible to completely disperse the drive timings and to substantially completely eliminate a cyclic error.

<Concerning Wiring>

As illustrated in FIG. 14, wiring in a case in which IQ mosaic driving is performed to obtain alignment of an I pixel, an I pixel, a Q pixel, and a Q pixel will be described.

Figure 20:
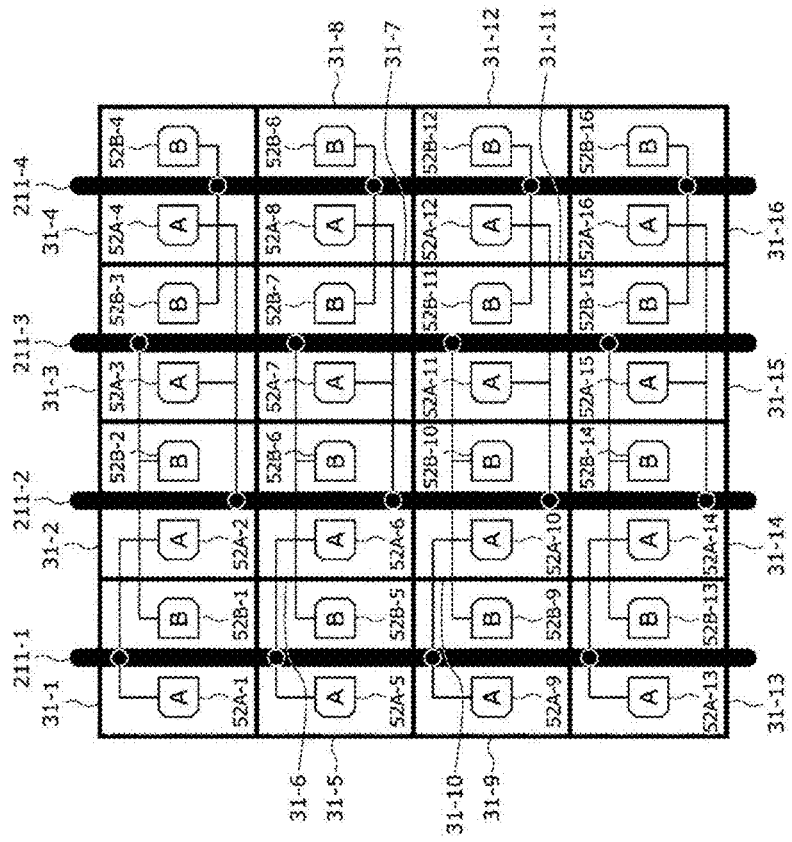
FIG. 20 is a diagram for explaining wiring.

FIG. 20 is a diagram for explaining wiring related to connection between the tap 52A and the tap 52B. More specifically, FIG. 20 is a diagram for explaining wiring related to connection between the transfer transistor 41A included in the tap 52A and a signal line that supplies an allocation signal DIMIX_A to the transfer transistor 41A and wiring related to connection between the transfer transistor 41B included in the tap 52B and a signal line that supplies an allocation signal DIMIX_B to the transfer transistor 41B.

FIG. 20 illustrates, as an example, sixteen pixels 31 of 4×4 arranged in the pixel array unit 32. Also, the arrangement of the sixteen pixels illustrated in FIG. 20 is assumed to be similar to the arrangement of sixteen pixels illustrated in the right diagram in FIG. 14. In other words, the pixels 31-1, 31-5, 31-9, and 31-13 arranged in the first column from the left in the drawing are I pixels. Also, the pixels 31-2, 31-6, 31-10, and 31-14 arranged in the second column from the left in the drawing are I pixels.

Also, the pixels 31-3, 31-7, 31-11, and 31-15 arranged in the third column from the left in the drawing are Q pixels. Additionally, the pixels 31-4 and the pixels 31-8, 31-12, and 31-16 arranged in the fourth column from the left in the drawing are Q pixels.

One row arranged on the upper side in the drawing will be referred to. The tap 52A-1 of the pixel 31-1 that is an I pixel and the tap 52A-2 of the pixel 31-2 that is an I pixel are connected. Also, the tap 52A-1 and the tap 52A-2 are connected to a signal line 211-1. The signal line 211-1 is formed in the column direction and is formed on the pixels 31-1, 31-5, 31-9, and 31-13 arranged in the first column from the left in the drawing.

The tap 52A-1 and the tap 52A-2 are taps for acquiring detection signals in the phase at 0 degrees, and the signal line 211-1 is a signal line for transmitting a signal for driving the transfer transistor 41A included in each of the tap 52A-1 and the tap 52A-2 in the phase at 0 degrees.

The tap 52B-1 of the pixel 31-1 that is an I pixel and the tap 52B-2 of the pixel 31-2 that is an I pixel are connected. Also, the tap 52B-1 and the tap 52B-2 are connected to a signal line 211-3. The signal line 211-3 is formed in the column direction and is formed on the pixels 31-3, 31-7, 31-11, and 31-15 arranged in the third column from the left in the drawing.

The tap 52B-1 and the tap 52B-2 are taps for acquiring detection signals in the phase at 180 degrees, and the signal line 211-3 is a signal line for transmitting a signal for driving the transfer transistor 41B included in each of the tap 52B-1 and the tap 52B-2 in the phase at 180 degrees.

The tap 52A-3 of the pixel 31-3 that is a Q pixel and the tap 52A-4 of the pixel 31-4 that is a Q pixel are connected. Also, the tap 52A-3 and the tap 52A-4 are connected to a signal line 211-2. The signal line 211-2 is formed in a column direction and is formed on the pixels 31-2, 31-6, 31-10, and 31-14 arranged in the second column from the left in the drawing.

The tap 52A-3 and the tap 52A-4 are taps for acquiring detection signals in the phase at 90 degrees, and the signal line 211-2 is a signal line for transmitting a signal for driving the transfer transistor 41A included in each of the tap 52A-3 and the tap 52A-4 in the phase at 90 degrees.

The tap 52B-3 of the pixel 31-3 that is a Q pixel and the tap 52B-4 of the pixel 31-4 that is a Q pixel are connected. Also, the tap 52B-3 and the tap 52B-4 are connected to a signal line 211-4. The signal line 211-4 is formed in the column direction and is formed on the pixel 31-4 and the pixels 31-8, 31-12, and 31-16 arranged in the fourth column from the left in the drawing.

The tap 52B-3 and the tap 52B-4 are taps for acquiring detection signals in the phase at 270 degrees, and the signal line 211-4 is a signal line for transmitting a signal for driving the transfer transistor 41B included in each of the tap 52B-3 and the tap 52B-4 in the phase at 270 degrees.

The pixels 31 in the second and following rows are similarly connected to the pixels 31 in the first row. Such wiring related to connection is formed in the wiring layer 142 (FIG. 6). Hereinafter, the wiring in the wiring layer 142 will be described.

<Concerning Wiring>

Figure 21:
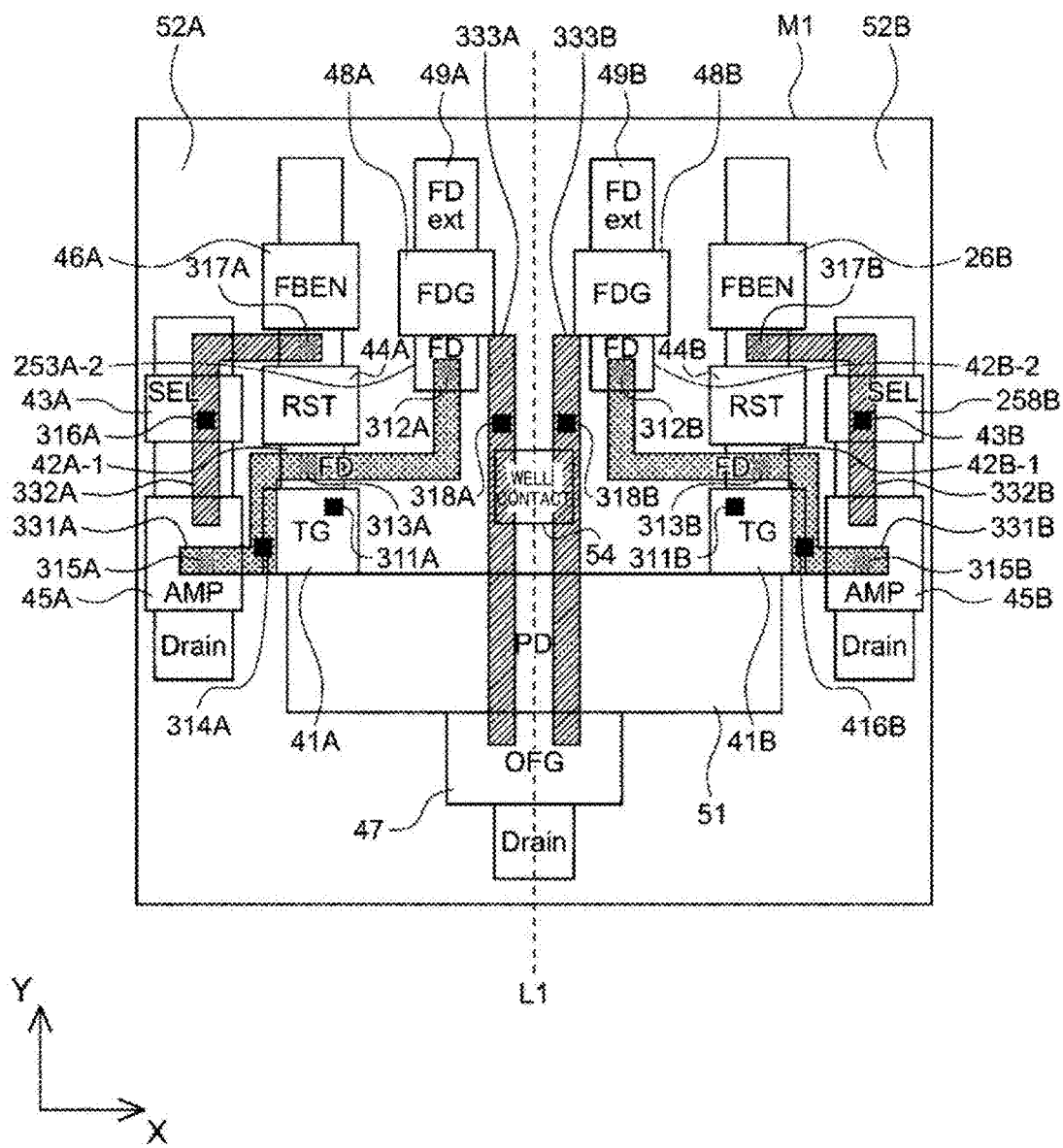
FIG. 21 is a diagram for explaining wiring in a wiring layer M1.
Figure 22:
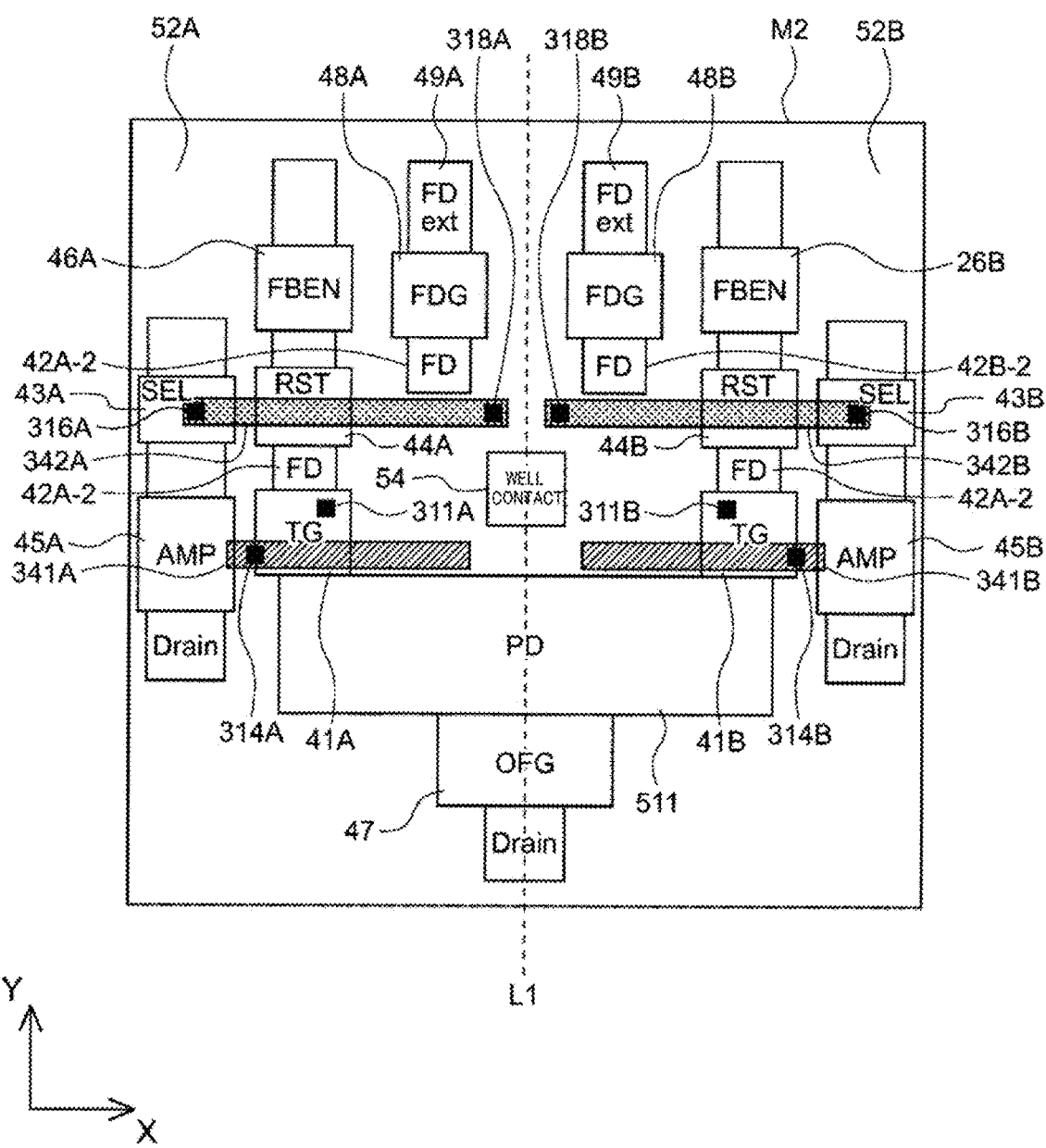
FIG. 22 is a diagram for explaining wiring in a wiring layer M2.

Wiring is formed in the multi-layer wiring layer 142 (FIG. 6) laminated on the semiconductor substrate 141 on which the PD 51 is formed. FIG. 21 is a diagram in which the wiring in the wiring layer M1 is added to the planar view of the pixel 31 illustrated in FIG. 5. FIG. 22 is a diagram in which the wiring in the wiring layer M2 is added to the planar view of the pixel 31 illustrated in FIG. 5.

Referring to FIG. 21, a via 311A for connecting the TG 251A to wiring formed in another wiring layer is formed on the lower side of the TG 41A. Note that a contact (not illustrated) connected to the via 311A is also formed on the lower side of the TG 41A.

Note that in the above description and the following description, connection includes physical connection and also includes a case in which components are formed such that charge or signals can be read even if physical connection is not established therebetween.

Referring to FIG. 21, the FD 42A-2, the FD 42A-1, and the AMP 45A are connected with a wiring 331A. A contact 312A, a contact 313A, and a contact 315A are formed in the FD 42A-2, the FD 42A-1, and the AMP 45A, respectively, and these contacts are connected to the wiring 331A.

The wiring 331A can also be used as a region configuring the FD 42A. It is possible to increase the capacity of the FD 42A by extending the wiring length of the wiring 331A.

Thus, a wiring 341A configuring a part of the FD 42A is formed in the wiring layer M2 as well as illustrated in FIG. 22. The wiring 341A is connected to the wiring 331A with a via 314A.

The via 314A is formed between the TG 41A and the AMP 45A in FIGS. 21 and 22. The wiring 331A is formed in the wiring layer M1, and the wiring 341A is formed in the wiring layer M2, such that they are connected to the via 314A.

Note that the wiring 341A is formed in order to increase the capacity of the FD 42A and is not wiring for connection as described above, and it is thus possible to omit the wiring 341A. Although the description will be continued here by exemplifying the case in which the wiring 341A is formed in the wiring layer M2, the wiring 341A may be formed in the wiring layer M3 or the wiring layer M4 other than the wiring layer M2.

Referring to FIG. 21, a wiring 332A is formed in a region corresponding to the lower side of the AMP 45A and the SEL 43A. The wiring 332A is connected to a contact 317A formed between a via 316A formed in the SEL 43A and a side of the RST 44A and the FBEN 46A (the region corresponding to the drain of the reset transistor 44A).

The wiring 332A is a portion corresponding to the parasitic capacity $C\_ST$ in the circuit diagram illustrated in FIG. 7. It is possible to further reduce KTC noise by increasing the capacity of the parasitic capacity $C\_ST$. Thus, a wiring 333A is provided in the wiring layer M1 as illustrated in FIG. 21, and a wiring 342A is provided in the wiring layer M2 as illustrated in FIG. 22 as regions corresponding to the parasitic capacity $C\_ST$. The portion corresponding to the parasitic capacity $C\_ST$ is configured by the wiring 332A, the wiring 333A, and the wiring 342A.

The wiring 332A formed in the wiring layer M1 is connected to the via 316A. Also, the wiring 333A formed in the wiring layer M1 is connected to a via 318A. The wiring 342A formed in the wiring layer M2 is connected to the via 316A and the via 318A. Therefore, the wiring 332A, the via 316A, the wiring 342A, the via 318A, and the wiring 333A are formed in a connected state and form the parasitic capacity $C\_ST$.

Referring to FIG. 21, the wiring 333A is formed as a wiring that extends from a region on the right side of the FD 42A-2 in the drawing up to the OFD 47 through the lower side of the well contact 54 and the PD 51.

The wiring related to the tap 52A is formed to have a linear symmetrical relationship with the wiring related to the tap 52B. The wiring related to the tap 52B will be referred to with reference to FIGS. 21 and 22.

Referring to FIG. 21, a via 311B for connecting the TG 251B to wiring formed in other wiring layers is formed on the lower side of the TG 41B. A contact (not illustrated) connected to the via 311B is also formed on the lower side of the TG 41B.

Referring to FIG. 21, the FD 42B-1, the FD 42B-2, and the AMP 45B are connected with a wiring 331B. A contact 312B, a contact 313B, and a contact 315B are formed in the FD 42B-1, the FD 42B-2, and the AMP 45B, respectively, and these contacts are connected to the wiring 331B.

As illustrated in FIG. 22, a wiring 341B configuring a part of the FD 42B is formed in the wiring layer M2 as well. The wiring 341B is connected to the wiring 331B with a via 314B.

Referring to FIG. 21, a wiring 332B is formed in the region corresponding to the lower side of the AMP 45B and the SEL 43B. The wiring 332B is connected to a contact 317B formed between a via 316B formed in the SEL 43B and a side of the RST 44B and the FBEN 46B (the region corresponding to the drain of the reset transistor 44B).

The wiring 332B formed in the wiring layer M1 is connected to the via 316B. Also, the wiring 333B formed in the wiring layer M1 is connected to a via 318B. The wiring 342B formed in the wiring layer M2 is connected to the via 316B and the via 318B. Therefore, the wiring 332B, the via 316B, the wiring 342B, the via 318B, and the wiring 333B are formed in a connected state and form the parasitic capacity C_ST.

Referring to FIG. 21, the wiring 333B is formed as wiring that extends from a region on the left side of the FD 42B-2 in the drawing up to the OFD 47 through the lower side of the well contact 54 and the PD 51.

In this manner, the wiring related to the tap 52B is formed in a linear symmetric relationship with the wiring related to the tap 52A.

The transistor, the wiring, and the like included in the tap 52A included in the pixel 31 and the transistor, the wiring, and the like included in the tap 52B in the pixel 31 are disposed to be linearly symmetrical with respect to the center line L1 in the pixel 31.

Therefore, it is possible to curb variations in lengths of wiring that contributes to noise canceling, for example, the lengths of the wiring 332, the wiring 333, and the like corresponding to the parasitic capacity C_ST, for example. It is thus possible to prevent a difference from occurring in performance related to noise reduction between the tap 52A and the tap 52B and to improve a distance measurement rule.

Figure 23:
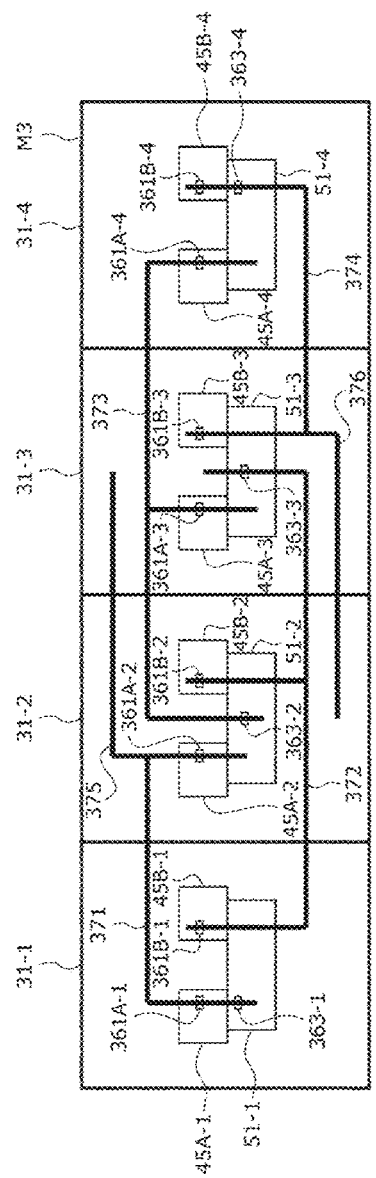
FIG. 23 is a diagram for explaining wiring in a wiring layer M3.
Figure 24:
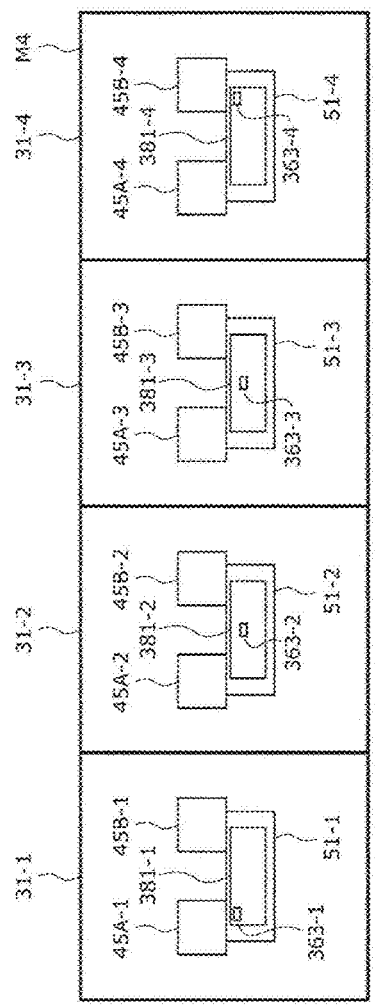
FIG. 24 is a diagram for explaining wiring in a wiring layer M4.
Figure 25:
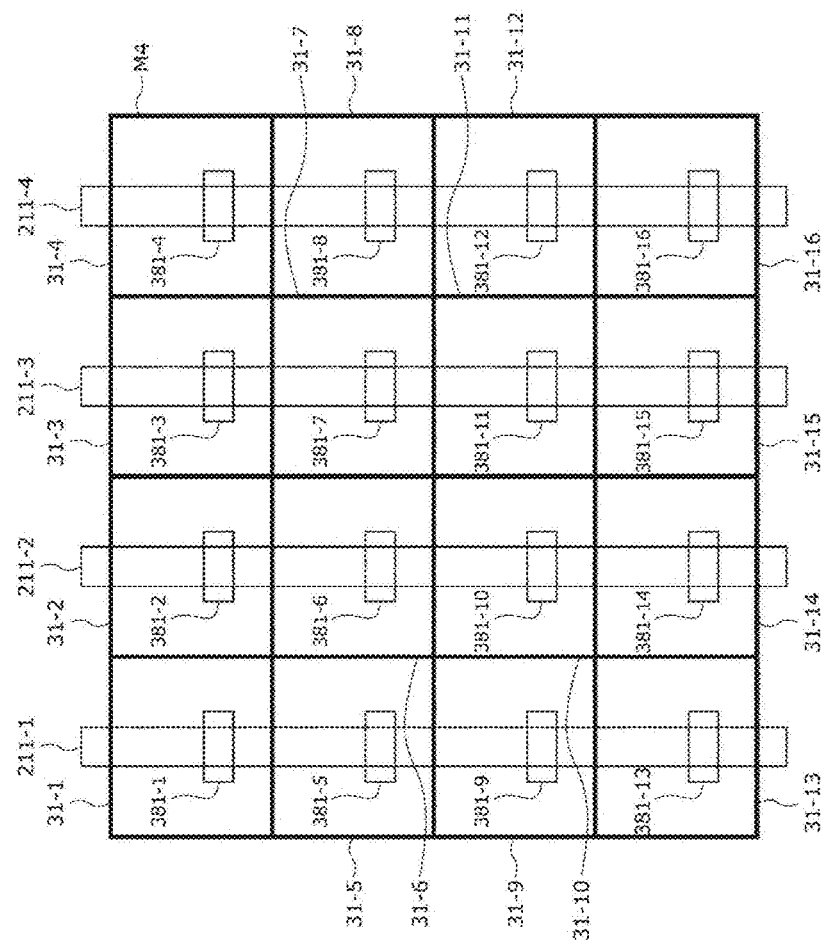
FIG. 25 is a diagram for explaining wiring connected to the wiring in the wiring layer M4.

FIG. 23 is a diagram for explaining the wiring in the wiring layer M3. FIG. 24 is a diagram for explaining the wiring in the wiring layer M4. FIG. 25 is a diagram for explaining a signal line connected to a contact provided in the wiring layer M4.

Since the wiring in the wiring layers M3 and M4 are disposed across a plurality of pixels 31, FIGS. 23 to 25 illustrates the pixels 31 with simplified configurations, and only portions necessary for description will be illustrated and described.

FIGS. 23 and 24 illustrate pixels 31-1 to 31-4 disposed in the row direction. A contact 361A-1 is formed in a region inside the wiring layer M3 corresponding to a region where the TG 45A-1 is formed in the pixel 31-1. The contact 361A-1 is connected to a via 311A formed in the wiring layer M1 and the wiring layer M2.

The via 311A is provided immediately below the TG 45, is formed linearly (into a shape close to a straight line), and is configured to be connected to the contact 361A formed in the wiring layer M3. It is possible to prevent the wiring capacity from being added (to reduce the wiring capacity) by shortening the wiring connected to the TG 45.

Similarly, the contact 361B-1 is formed in a region inside the wiring layer M3 corresponding to a region where the TG 45B-1 is formed in the pixel 31-1. The contact 361B-1 is connected to a via 311B formed in the wiring layer M1 and the wiring layer M2.

Similarly, the contact 361A-2 is formed in the region inside the wiring layer M3 corresponding to a region where the TG 45A-2 is formed in the pixel 31-2, the contact 361B-2 is formed in the region inside the wiring layer M3 corresponding to a region where the TG 45B-2 is formed, and the contact 361A-2 and the contact 361B-2 are connected to the corresponding vias 311A and 311B, respectively.

Similarly, the contact 361A-3 is formed in the region inside the wiring layer M3 corresponding to a region where the TG 45A-3 is formed in the pixel 31-3, the contact 361B-3 is formed in the region inside the wiring layer M3 corresponding to a region where the TG 45B-3 is formed, and the contact 361A-3 and the contact 361B-3 are connected to the corresponding vias 311A and 311B, respectively.

Similarly, the contact 361A-4 is formed in the region inside the wiring layer M3 corresponding to a region where the TG 45A-4 is formed in the pixel 31-4, the contact 361B-4 is formed in the region inside the wiring layer M3 corresponding to a region where the TG 45B-4 is formed, and the contact 361A-4 and the contact 361B-4 are connected to the corresponding vias 311A and 3S11B, respectively.

The wiring formed in the wiring M3 is a wiring for establishing connection between the taps 52 described above with reference to FIG. 20. As described above with reference to FIG. 20, the tap 52A-1 of the pixel 31-1 and the tap 52A-2 of the pixel 31-2 are connected. The connection is realized by the contact 361A-1 of the TG 45A-1 configuring the tap 52A-1 of the pixel 31-1 and the contact 361A-2 of the TG 45A-2 configuring the tap 52A-2 of the pixel 31-2 being connected with a wiring 371 in the wiring layer M3 as illustrated in FIG. 23.

The wiring 371 is also connected to the via 363-1. The via 363-1 is formed in the region inside the wiring layer M3 corresponding to the region where the PD 51-1 is formed. Also, the via 363-1 is connected to a contact 381-1 illustrated in FIG. 24. The contact 381-1 is connected to a signal line 211-1 as illustrated in FIG. 25.

Referring to FIG. 23, the contact 361B-1 of the TG 45B-1 configuring the tap 52B-1 of the pixel 31-1 and the contact 361B-2 of the TG 45B-2 configuring the tap 52B-2 of the pixel 31-2 are connected with a wiring 372. The wiring 372 is also connected to the via 363-3 formed in the region inside the wiring layer M3 corresponding to a region where the PD 51-3 is formed.

The via 363-3 is connected to a contact 381-3 illustrated in FIG. 24. The contact 381-3 is connected to the signal line 211-3 as illustrated in FIG. 25.

Referring to FIG. 23, the contact 361A-3 of the TG 45A-3 configuring the tap 52A-3 of the pixel 31-3 and the contact 361A-4 of the TG 45A-4 configuring the tap 52A-4 of the pixel 31-4 are connected with a wiring 373. The wiring 373 is also connected to the via 363-2 formed in the region inside the wiring layer M3 corresponding to a region where the PD 51-2 is formed.

The via 363-2 is connected to a contact 381-2 illustrated in FIG. 24. The contact 381-2 is connected to the signal line 211-2 as illustrated in FIG. 25.

Referring to FIG. 23, the contact 361B-3 of the TG 45B-3 configuring the tap 52B-3 of the pixel 31-3 and the contact 361B-4 of the TG 45B-4 configuring the tap 52B-4 of the pixel 31-4 are connected with a wiring 374. The wiring 374 is also connected to the via 363-4 formed in the region inside the wiring layer M3 corresponding to a region where the PD 51-4 is formed.

The via 363-4 is connected to a contact 381-4 illustrated in FIG. 24. The contact 381-4 is connected to the signal line 211-4 as illustrated in FIG. 25.

The signal line 211-1 illustrated in FIG. 25 will be referred to. The signal line 211-1 is a signal line disposed across the pixel 31-1, the pixel 31-5, the pixel 31-9, and the pixel 31-13 disposed in the column direction similarly to the case described above with reference to FIG. 20. Also, the signal line 211-1 is a signal line to transmit a signal for controlling the transfer transistor 41A in order to obtain a detection result of a phase at 0 degrees.

The signal line 211-1 is connected to the contact 381-1 provided inside a region corresponding to the pixel 31-1 as illustrated in FIG. 25. The via 363-1 is connected to the contact 381-1 as illustrated in FIG. 24. Also, the wiring 371 is connected to the via 363-1 as illustrated in FIG. 23.

The wiring 371 is connected to the contact 361A-1, and the contact 361A-1 is connected to the via 311A (FIGS. 21 and 22). Finally, the via 311A is connected to the contact formed in the TG 41A (the gate of the transfer transistor 41A). Therefore, the TG 41A is connected to the signal line 211-1, and driving is controlled by a signal from the signal line 211-1.

Each of the signal lines 211-2 to 211-4 is also connected to the corresponding TG 41 and is configured such that a signal for controlling driving is transmitted to the corresponding TG 41. Wiring connecting the signal lines 211-1 to 211-4 to the TG 41 is disposed as described above with reference to FIG. 23. Here, FIG. 23 will be referred to again.

The wiring 371 connects the contact 361A-1 included in the tap 52A-1 to the contact 361A-2 included in the tap 52A-2. Also, the wiring 371 is connected to the via 363-1 inside the tap 52A-1. The length of the wiring 371 is assumed to be a length L1.

The wiring 372 connects the contact 361B-1 included in the tap 52B-1 to the contact 361B-2 included in the tap 52B-2. Moreover, the wiring 372 is also connected to the via 363-3 included in the pixel 31-3. The length of the wiring 372 is assumed to be a length L2.

The wiring 373 connects the contact 361A-3 included in the tap 52A-3 to the contact 361A-4 included in the tap 52A-4. Moreover, the wiring 373 is also connected to the via 363-2 included in the pixel 31-2. The length of the wiring 373 is assumed to be a length L3.

The wiring 374 connects the contact 361B-3 included in the tap 52B-3 to the contact 361B-4 included in the tap 52B-4. Also, the wiring 371 is connected to the via 363-4 inside the tap 52A-4. The length of the wiring 374 is assumed to be a length L4.

The length L1 and the length L4 are substantially the same lengths. The length L1 and the length L2 are lengths of the wiring connecting the taps (TGs 45) of the adjacent pixels. Also, the length L2 and the length L3 are substantially the same lengths. The length L2 and the length L3 are lengths of wiring connecting taps (TGs 45) of the adjacent pixels and further wiring extending up to the vias of adjacent pixels.

However, the length L1 (length L4) and the length L2 (length L3) are different lengths. There is a probability that variations may occur in parasitic capacity due to different lengths of the wiring. Setting the lengths L1 to L4 to be the same in order to prevent variations from occurring in the parasitic capacity is conceivable.

Since the length L1 of the wiring 371 is shorter than the length L3 of the wiring 373, a redundant wiring 375 is added to the wiring 371. In a case in which the length obtained by adding the wiring 371 and the redundant wiring 375 is assumed to be a length L5, the length L5 is substantially the same length as the length L3 of the wiring 373.

Note that an exemplary case in which parasitic capacity is adjusted to be the same by adjusting the lengths of the wiring to be the same will be described here. Additionally, the description will be given on the assumption that the parasitic capacity is the same if the lengths of the wiring are the same. However, the parasitic capacity is not determined only by the lengths of the wiring, and for example, the distance to another wiring, the size of the wiring, and the like are also related thereto.

Therefore, in a case in which the parasitic capacity is adjusted more accurately, the length of the redundant wiring 375 is set not only by setting the length L5 of both the wiring 371 and the redundant wiring 375 to be the same as the length L3 but also by taking other elements into consideration.

The length L5 is set to be such a length that substantially the same parasitic capacity as that of the length L3 is achieved. In other words, the redundant wiring 375 is wiring added to the wiring 371 such that the same parasitic capacity as the parasitic capacity generated by the wiring 373 with the length L3 is achieved, and the length of the redundant wiring 375 is set to be such a length that the same parasitic capacity as the parasitic capacity generated by the wiring 373 with the length L3 is achieved, for example.

Note that although description of the redundant wiring is given here, this means the wiring for adjusting the parasitic capacity and the wiring added to predetermined wiring as described above. The redundant wiring is wiring formed for other purposes than connection to the contacts, the vias, and the like separately from the wiring formed for the purpose of connection to the contacts, the vias, and the like.

Similarly, since the length L4 of the wiring 374 is shorter than the length L2 of the wiring 373, the redundant wiring 376 is added to the wiring 374. The redundant wiring 376 is wiring added to the wiring 374 in order to achieve the same parasitic capacity as the parasitic capacity generated by the wiring 372 with the length L2, for example, and the length of the redundant wiring 376 is set to be such a length that the same parasitic capacity as the parasitic capacity generated by the wiring 372 with the length L2 is achieved.

The redundant wiring 375 and the redundant wiring 376 may be provided in a layer that is different from the layer where the wirings 371 to 374 are formed. For example, a configuration in which the redundant wiring 375 and the redundant wiring 376 are formed in the wiring layer M2 and the wiring layer M4 that are different from the wiring layer M3 where the wirings 371 to 374 are formed and are connected with a via may be employed.

Also, the redundant wiring 375 and the redundant wiring 376 may be formed to have a different thickness from that of the wirings 371 to 374. Additionally, the redundant wiring 375 and the redundant wiring 376 may be formed into one wiring as illustrated in FIG. 23 or may be formed as a plurality of wirings. Also, the redundant wiring 375 and the redundant wiring 376 may be formed into a linear shape as illustrated in FIG. 23, or may be formed into a shape other than the linear shape, such as a shape with a curved line or a loop, for example.

Note that the aforementioned embodiment is a case in which the transfer transistors in the taps are connected, and the exemplary case in which the redundant wirings are provided at wirings connected to the transfer transistors has been described. The present technique can also be applied to wiring that connects transistors other than the transfer transistors in the taps.

Also, the present technique can also be applied to an imaging element other than the two-tap configuration. For example, the present technique can also be applied to an imaging element including one transfer transistor in one pixel, and in a case in which the present technique is applied to such an imaging element, a configuration in which a redundant wiring is provided for a wiring connecting predetermined transistors inside adjacent pixels can be employed.

In this manner, a redundant wiring for adjusting the parasitic capacity is provided. Therefore, it is possible to curb variations in parasitic capacity. In a case where a pixel to which the present technique is applied to a pixel that performs distance measurement, it is possible to perform distance measurement with enhanced precision.

Although the example in which the disposition, the size, and the like of the transistors are changed has been described as the embodiment, the disposition and the size are just an example, and it is also possible to apply the present technique to disposition and the size other than those described here.

As described above, the pixel to which the present technique is applied is configured such that a region configuring FD (floating diffusion region) is disposed in a dispersed manner into two regions and the two regions are connected to be regarded as one FD. It is possible to enhance a degree of freedom in disposition by disposing the FD in a dispersed manner into the two regions. It is also possible to form the FD as a larger region than that in a case in which FD is provided as one region, by disposing the FD in a dispersed manner in the two regions.

Note that FD may be provided by being split into two regions or two or more regions in the aforementioned embodiment.

As described above, the pixel to which the present technique is applied is configured such that the capacity of FD can be further increased by providing the conversion efficiency switching transistor (FDG) that converts the capacity of FD and the additional capacity unit. Also, a configuration capable of further increasing the capacity of FD is obtained by providing the wiring that forms a part of the FD at the laminated wiring layer as well. In this manner, according to the pixel to which the present technique is applied, it is possible to obtain a pixel in which the capacity of FD is increased.

As described above, since the pixel to which the present technique is applied is configured to be provided with the feedback enable transistor (FBEN) such that the parasitic capacity C_ST and the parasitic capacity C_FB can be further secured with a wiring, it is possible to reduce noise such as KTC noise.

As described above, in a case in which the present technique is applied to the pixel with the two-tap configuration, the transistors and the wirings in the taps are disposed to be linearly symmetrical inside the pixel, and it is thus possible to eliminate variations in length of the wirings. Although there is a probability that if there are variations in length of wirings, wiring capacity may differ and it is not possible to appropriately curb noise, it is possible to reduce the probability that such a matter may occur by applying the present technique.

Since the redundant wiring to adjust the parasitic capacity is provided, it is possible to curb variations in parasitic capacity. In a case where a pixel to which the present technique is applied to a pixel that performs distance measurement, it is possible to perform distance measurement with enhanced precision.

Note that the present technique can be applied to a scheme that is called a continuous-wave scheme from among the indirect ToF schemes, in which light to be projected to an object is subjected to amplification modulation. As a structure of the photodiode 51 in the light receiving unit 15, it is possible to apply the present technique to a distance measurement sensor with a structure of allocating charge to two charge accumulation units, such as a distance measurement sensor with a current assisted photonic demodulator (CAPD) and a distance measurement sensor based on a gate scheme in which the charge of the photodiode is applied alternately between the two gates.

Although the case in which the pixel 31 has a two-tap structure in which the charge generated by the photodiode 51 is allocated to the two taps, namely the tap 52A and the tap 52B has been described in the above embodiment, the present technique can also be applied to a pixel structure with other number of taps, such as a one-tap structure and a four-tap structure.

<Chip Configuration Example of Distance Measurement Sensor>

Figure 26:
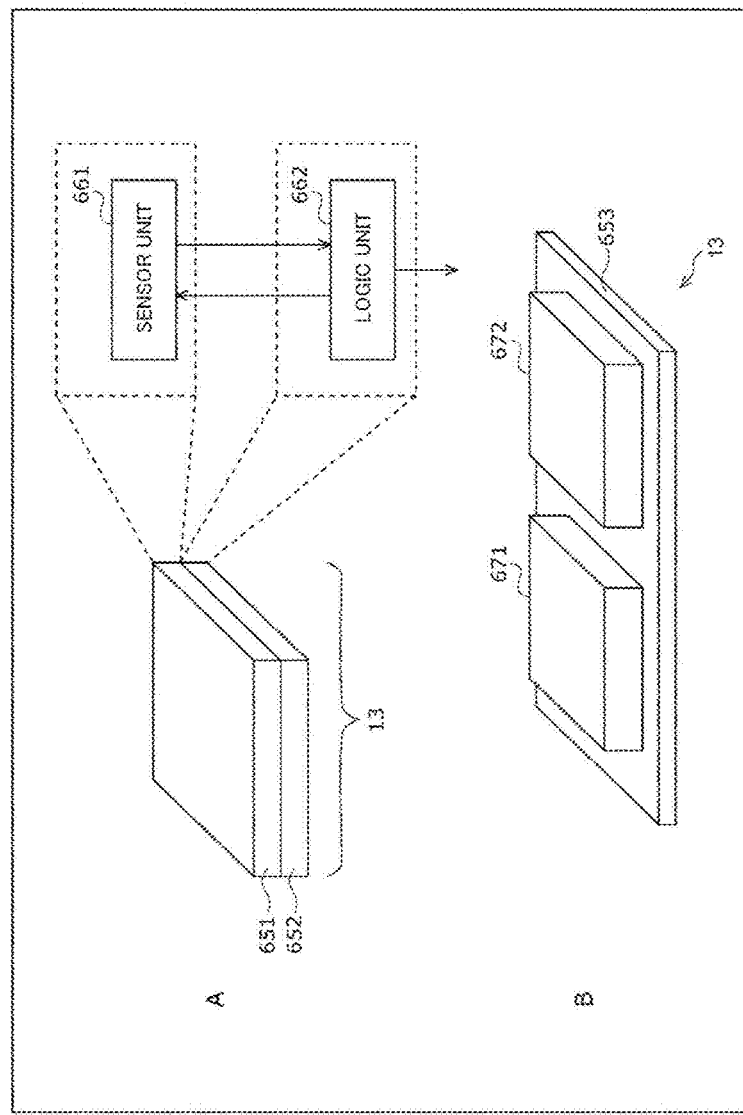
FIG. 26 is a perspective view illustrating a chip configuration example of a distance measurement sensor.

FIG. 26 is a perspective view illustrating a chip configuration example of the distance measurement sensor 13.

The distance measurement sensor 13 can be configured by one chip in which a sensor die 651 and a logic die 652 as a plurality of dies (substrates) are laminated as illustrated in A of FIG. 26, for example.

The sensor die 651 includes (a circuit as) a sensor unit 661, and the logic die 652 includes a logic unit 662.

For example, the pixel array unit 32 and the drive control circuit 33 may be formed in the sensor unit 661. A pulse generation circuit 71, a controller 72, an AD conversion unit that performs AD conversion on detection signals, a signal processing unit 16, and an input/output terminal, for example, are formed in the logic unit 662.

Further, the distance measurement sensor 13 may be configured of three layers in which another logic die is laminated in addition to the sensor die 651 and the logic die 652. It is a matter of course that the distance measurement sensor 13 may be configured by dies (substrates) in four or more layers.

Alternatively, the distance measurement sensor 13 may be configured by, for example, a first chip 671 and a second chip 672, and a relay substrate (interposer substrate) 673 on which they are mounted, as illustrated in B of FIG. 26.

For example, the pixel array unit 32 and the drive control circuit 33 are formed on the first chip 671. A pulse generation circuit 71, a controller 72, an AD conversion unit that performs AD conversion on detection signals, a signal processing unit 16, and the like are formed on the second chip 672.

Note that the circuit disposition of the sensor die 651 and the logic die 652 in A of FIG. 26 and the circuit disposition of the first chip 671 and the second chip 672 in B of FIG. 26 described above are just examples, and the present invention is not limited thereto. For example, the signal processing unit 16 that performs processing of generating a depth map or the like may be provided outside (another chip) of the distance measurement sensor 13.

<Configuration Example of Electronic Device>

The aforementioned distance measurement module 11 can be mounted in an electronic device such as a smartphone, a tablet terminal, a mobile phone, a personal computer, a game device, a television receiver, a wearable terminal, a digital still camera, or a digital video camera, for example.

Figure 27:
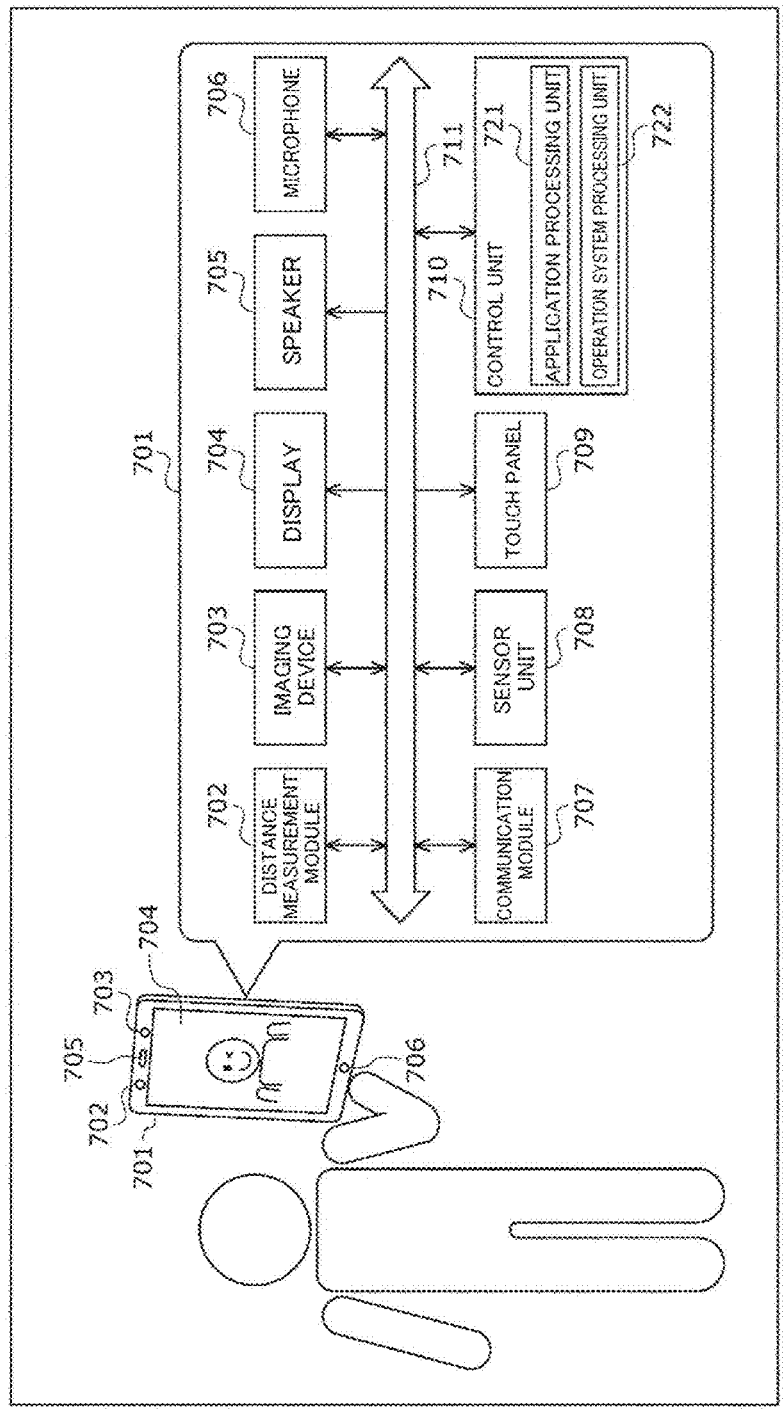
FIG. 27 is a block diagram illustrating a configuration example of a smartphone that is an electronic device with the distance measurement module mounted thereon.

FIG. 27 is a block diagram illustrating a configuration example of a smartphone as an electronic device with the distance measurement module mounted thereon.

As illustrated in FIG. 27, a smartphone 701 is configured by a distance measurement module 702, an imaging device 703, a display 704, a speaker 705, a microphone 706, a communication module 707, a sensor unit 708, a touch panel 709, and a control unit 710 connected to each other via a bus 711. Further, the control unit 710 has functions as an application processing unit 721 and an operation system processing unit 722 by causing a CPU to execute a program.

The distance measurement module 11 illustrated in FIG. 1 is applied to the distance measurement module 702. For example, the distance measurement module 702 is disposed on the front surface of the smartphone 701, and can output a depth value of a surface shape of the face, hand, finger, or the like of a user of the smartphone 701 as a distance measurement result by performing distance measurement on a user of the smartphone 701.

The imaging device 703 is disposed on the front surface of the smartphone 701, and acquires an image capturing the user of the smartphone 701 by imaging the user as a subject. Note that although not illustrated in the drawing, a configuration in which the imaging device 703 is also disposed on the back surface of the smartphone 701 may be adopted.

The display 704 displays an operation screen for performing processing by the application processing unit 721 and the operation system processing unit 722, an image captured by the imaging device 703, and the like. The speaker 705 and the microphone 706 perform, for example, outputting of sound from a counterpart and collecting of user's sound when making a call using the smartphone 701.

The communication module 707 performs communication via a communication network. The sensor unit 708 senses a speed, acceleration, proximity, and the like, and the touch panel 709 acquires a user's touch operation on an operation screen displayed on the display 704.

The application processing unit 721 performs processing for providing various services through the smartphone 701. For example, the application processing unit 721 can perform processing of creating a face based on computer graphics that virtually reproduces the user's facial expression on the basis of a depth supplied from the distance measurement module 702, and displaying the created face on the display 704. In addition, the application processing unit 721 can perform processing of creating, for example, three-dimensional shape data of an arbitrary three-dimensional object on the basis of the depth supplied from the distance measurement module 702.

The operation system processing unit 722 performs processing for realizing basic functions and operations of the smartphone 701. For example, the operation system processing unit 722 can perform processing for authenticating a user's face on the basis of a depth value supplied from the distance measurement module 702, and unlocking the smartphone 701. In addition, the operation system processing unit 722 can perform, for example, processing for recognizing a user's gesture on the basis of a depth value supplied from the distance measurement module 702, and can perform processing for inputting various operations according to the gesture.

According to the smartphone 701 configured in this manner, it is possible to generate a depth map with high precision at a high speed, for example, by applying the aforementioned distance measurement module 11. The smartphone 701 can thus more accurately detect distance measurement information.

<Example of Application in Moving Body>

The technique according to the present disclosure (the present technique) can be applied in various products. For example, the technique according to the present disclosure may be realized as a device mounted on any type of moving body such as an automobile, an electric automobile, a hybrid electric automobile, a motorcycle, a bicycle, a personal mobility device, an airplane, a drone, a ship, a robot, or the like.

Figure 28:
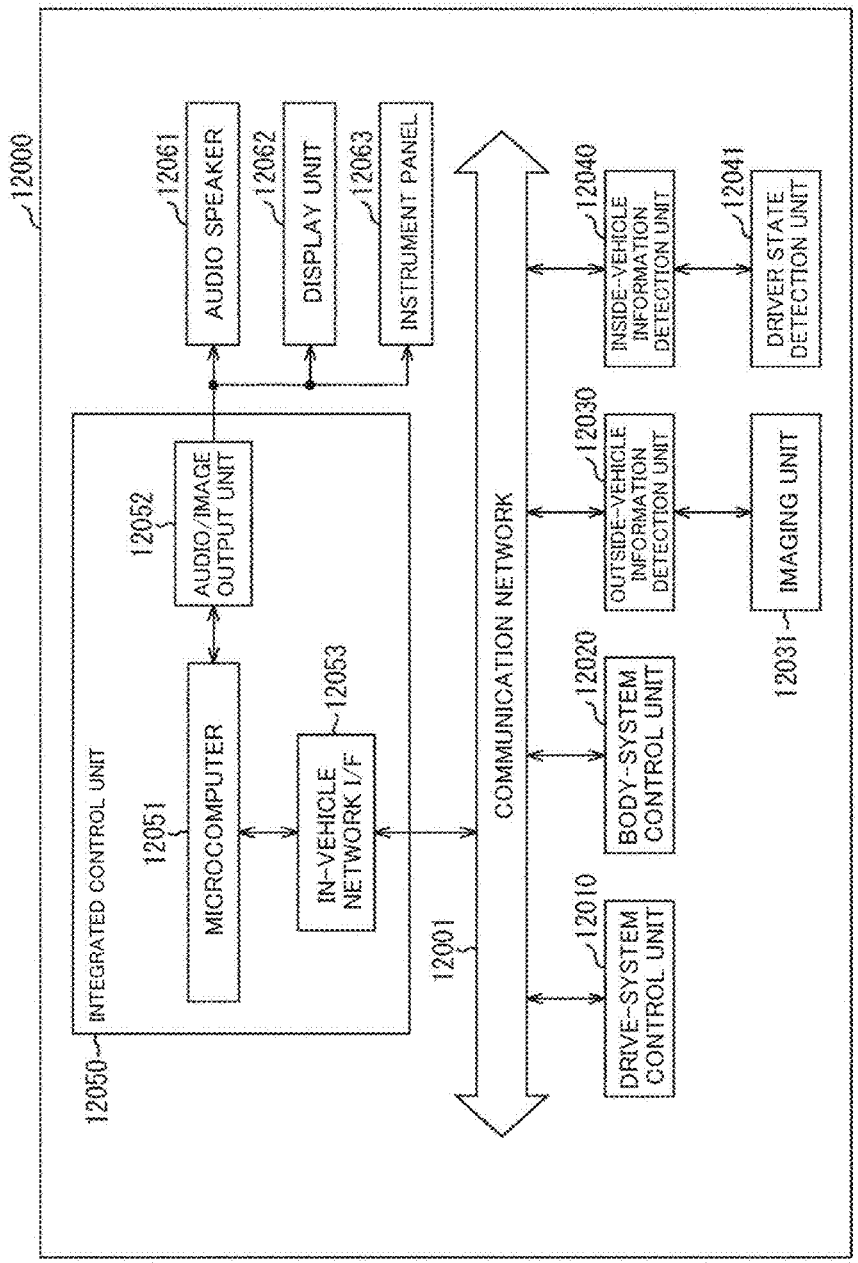
FIG. 28 is a block diagram illustrating an exemplary schematic configuration of a vehicle control system.

FIG. 28 is a block diagram showing a schematic configuration example of a vehicle control system, which is an example of a moving object control system to which the technique according to the present disclosure can be applied.

The vehicle control system 12000 includes a plurality of electronic control units connected via a communication network 12001. In the example shown in FIG. 28, the vehicle control system 12000 includes a drive system control unit 12010, a body system control unit 12020, an outside-vehicle information detection unit 12030, an inside-vehicle information detection unit 12040, and an integrated control unit 12050. In addition, as the functional configuration of the integrated control unit 12050, a microcomputer 12051, an audio/image output unit 12052, and an in-vehicle network interface (I/F) 12053 are illustrated.

The drive system control unit 12010 controls operations of devices related to a drive system of a vehicle according to various programs. For example, the drive system control unit 12010 functions as a driving force generation device for generating a driving force of a vehicle such as an internal combustion engine or a driving motor, a driving force transmission mechanism for transmitting a driving force to wheels, a steering mechanism for adjusting a turning angle of a vehicle, and a control device such as a braking device that generates a braking force of a vehicle.

The body system control unit 12020 controls operations of various devices mounted in the vehicle body in accordance with various programs. For example, the body system control unit 12020 functions as a control device of a keyless entry system, a smart key system, a power window device, or various lamps such as a head lamp, a back lamp, a brake lamp, a turn signal, and a fog lamp. In this case, radio waves transmitted from a portable device that substitutes for a key or signals of various switches can be input to the body system control unit 12020. The body system control unit 12020 receives inputs of these radio waves or signals and controls a door lock device, a power window device, a lamp, and the like of the vehicle.

The outside-vehicle information detection unit 12030 detects information outside the vehicle in which the vehicle control system 12000 is mounted. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for people, cars, obstacles, signs, and letters on the road on the basis of the received image.

The imaging unit 12031 is an optical sensor that receives light and outputs an electrical signal according to the intensity of the light received. The imaging unit 12031 can output an electrical signal as an image or output it as a distance measurement information. In addition, the light received by the imaging unit 12031 may be visible light or invisible light such as infrared rays.

The inside-vehicle information detection unit 12040 detects information on the inside of the vehicle. For example, a driver state detection unit 12041 that detects a driver's state is connected to the inside-vehicle information detection unit 12040. The driver state detection unit 12041 includes, for example, a camera that captures an image of a driver, and the inside-vehicle information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generator, the steering mechanism, or the braking device on the basis of the information on inside and outside the vehicle acquired by the outside-vehicle information detection unit 12030 or the inside-vehicle information detection unit 12040, and output a control command to the drive system control unit 12010. For example, the microcomputer 12051 can perform cooperative control in order to realize functions of an advanced driver assistance system (ADAS) such as vehicle collision avoidance, impact mitigation, following traveling based on the inter-vehicle distance, vehicle speed maintenance driving, vehicle collision warning, and vehicle lane deviation warning.

Further, the microcomputer 12051 can perform cooperative control for the purpose of automated driving or the like in which autonomous travel is performed without depending on operations of the driver by controlling the driving force generator, the steering mechanism, the braking device, and the like on the basis of information regarding the surroundings of the vehicle acquired by the outside-vehicle information detection unit 12030 or the inside-vehicle information detection unit 12040.

In addition, the microcomputer 12051 can output a control command to the body system control unit 12020 based on the information outside the vehicle acquired by the outside-vehicle information detection unit 12030. For example, the microcomputer 12051 can perform cooperative control for antiglare such as switching a high beam to a low beam by controlling a headlamp according to a position of a preceding vehicle or an oncoming vehicle detected by the outside-vehicle information detection unit 12030.

The audio/image output unit 12052 transmits an output signal of at least one of audio and an image to an output device that can visually or audibly notify an occupant of the vehicle or the outside of information. In the example shown in FIG. 28, as such an output device, an audio speaker 12061, a display unit 12062 and an instrument panel 12063 are shown. The display unit 12062 may include, for example, at least one of an onboard display and a head-up display.

Figure 29:
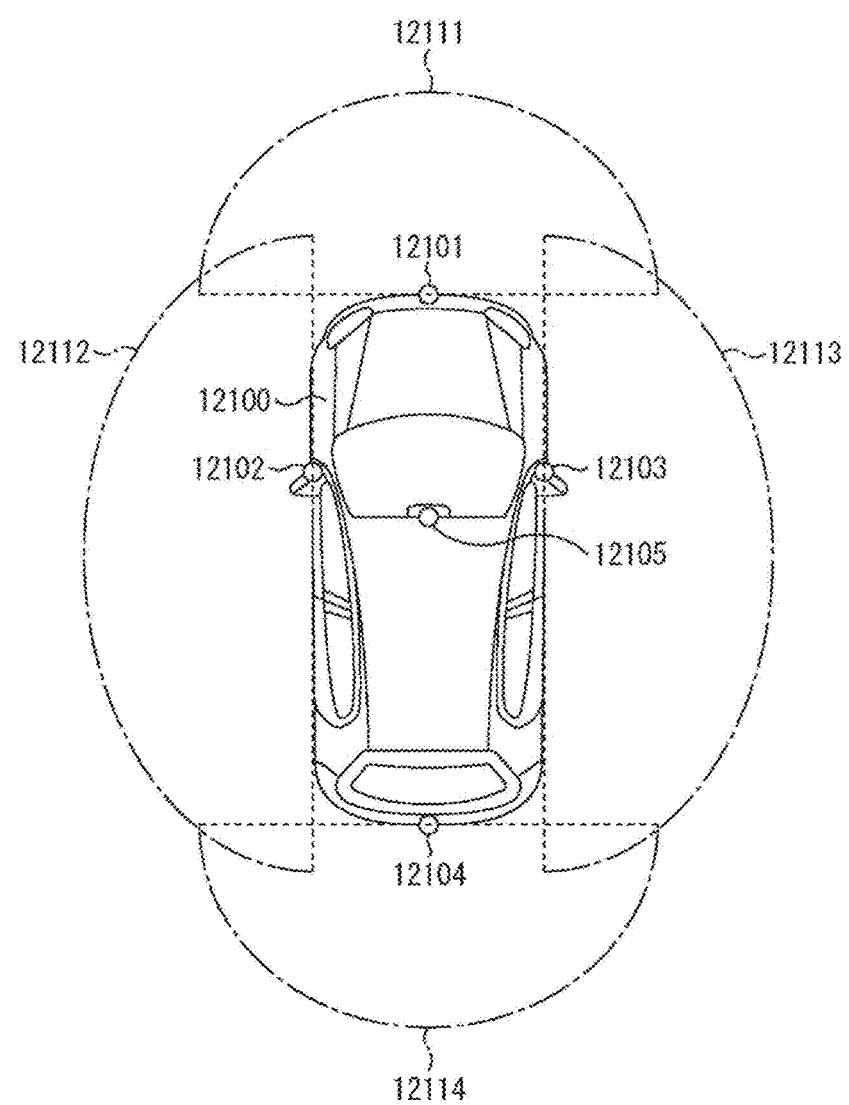
FIG. 29 is an explanatory diagram illustrating an example of the installation positions of outside-vehicle information detection units and imaging units.

FIG. 29 is a diagram illustrating an example of an installation position of the imaging unit 12031.

In FIG. 29, a vehicle 12100 includes imaging units 12101, 12102, 12103, 12104, and 12105 as the imaging unit 12031.

The imaging units 12101, 12102, 12103, 12104, and 12105 may be provided at positions such as a front nose, side-view mirrors, a rear bumper, a back door, and an upper portion of a windshield in a vehicle interior of the vehicle 12100, for example. The imaging unit 12101 provided at the front nose and the imaging unit 12105 provided at an upper portion of the windshield in the vehicle interior mainly acquire front view images of the vehicle 12100. The imaging units 12102 and 12103 provided on the side mirrors mainly acquire images on the lateral sides of the vehicle 12100. The imaging unit 12104 provided on the rear bumper or the back door mainly acquires images in the rear of the vehicle 12100. The front view images acquired by the imaging units 12101 and 12105 are mainly used for detection of preceding vehicles, pedestrians, obstacles, traffic signals, traffic signs, lanes, and the like.

Here, FIG. 29 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function for acquiring distance information. For example, at least one of the imaging units 12101 to 12104 may be a stereo camera constituted by a plurality of imaging elements or may be an imaging element having pixels for phase difference detection.

For example, the microcomputer 12051 determines a distance to each three-dimensional object in the imaging ranges 12111 to 12114, and a change in the distance over time (a relative speed with respect to the vehicle 12100) based on the distance information obtained from the imaging units 12101 to 12104, and particularly, can extract a three-dimensional object that travels at a predetermined speed (for example, 0 km/h or more) in almost the same direction as the vehicle 12100, which is the closest three-dimensional object on the traveling path of the vehicle 12100, as a preceding vehicle. In addition, the microcomputer 12051 can set an inter-vehicle distance to be secured in advance in front of the preceding vehicle, and perform automatic brake control (including following stop control), automatic acceleration control (including following start control), and the like. In this manner, it is possible to perform cooperative control for automatic driving in which autonomous driving is performed without the operation of the driver.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of distance information obtained from the imaging units 12101 to 12104 and use the three-dimensional object data for automatic avoidance of obstacles. For example, the microcomputer 12051 identifies obstacles in the vicinity of the vehicle 12100 into obstacles that can be visually recognized by the driver of the vehicle 12100 and obstacles that are difficult to visually recognize. Then, the microcomputer 12051 can determine a risk of collision indicating the degree of risk of collision with each obstacle, and can perform driving assistance for collision avoidance by outputting a warning to a driver through the audio speaker 12061 or the display unit 12062 and performing forced deceleration or avoidance steering through the drive system control unit 12010 when the risk of collision has a value equal to or greater than a set value and there is a possibility of collision.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating the outline of the object and it is determined whether the object is a pedestrian. When the microcomputer 12051 determines that there is a pedestrian in the captured images of the imaging units 12101 to 12104, and the pedestrian is recognized, the audio/image output unit 12052 controls the display unit 12062 so that the recognized pedestrian is superimposed and displayed with a square contour line for emphasis. In addition, the audio/image output unit 12052 may control the display unit 12062 so that an icon indicating a pedestrian or the like is displayed at a desired position.

The embodiments of the present technique are not limited to the aforementioned embodiments, and various changes can be made without departing from the gist of the present technique.

The present technique described as various modes in the present specification may be implemented independently alone as long as no contradiction arises. It is a matter of course that any number of modes of the present technique may be used in combination. For example, part or all of the present technique described in any of the embodiments may be implemented in combination with part or all of the present technique described in the other embodiments. Further, a part or all of the aforementioned present technique may be implemented in combination with other techniques not described above.

Further, for example, the configuration described as one device (or one processing unit) may be divided to be configured as a plurality of devices (or processing units). On the other hand, the configuration described above as the plurality of devices (or processing units) may be collected and configured as one device (or processing unit). A configuration other than the above-described configuration may be added to the configuration of each device (or each processing unit). Further, when the configuration or the operation are substantially the same in the entire system, a part of the configuration of a certain device (or processing unit) may be included in the configuration of another device (or another processing unit).

Further, in the present specification, the system means a set of a plurality of components (devices, modules (parts), etc.), and it does not matter whether or not all the components are arranged in a single housing. Thus, a plurality of devices accommodated in separate housings and connected via a network, and one device in which a plurality of modules are accommodated in one housing are both systems.

The effects described in the present specification are merely examples and are not limited, and there may be effects other than those described in the present specification.

The present technique can employ the following configurations.

(1)
An imaging element including: a first wiring that connects predetermined transistors in first adjacent pixels to a via formed in one of the first adjacent pixels and connected to a wiring formed in another layer; and a second wiring that connects predetermined transistors in second adjacent pixels to a via formed in a pixel that is adjacent to one of the second adjacent pixels and connected to a wiring formed in another layer, in which the first wiring is connected to a redundant wiring.

(2)
The imaging element according to (1), in which a layer where the predetermined transistors are provided and a layer where the first wiring and the second wiring are provided are different layers.

(3)
The imaging element according to (1) or (2), in which each of the via is formed into a substantially linear shape.

(4)
The imaging element according to any one of (1) to (3), in which the pixels include a photoelectric conversion unit that performs photoelectric conversion, a plurality of charge accumulation units that accumulate charge obtained by the photoelectric conversion unit, and a plurality of transfer units that transfer the charge from the photoelectric conversion unit to each of the plurality of charge accumulation units, and the predetermined transistors are the transfer units.

(5)
The imaging element according to (4), in which the pixels further include a plurality of reset units that reset each of the plurality of charge accumulation units, a plurality of reset voltage control units that controls a voltage to be applied to each of the plurality of reset units, and a plurality of addition control units that control addition of capacity to each of the plurality of charge accumulation units, and each charge accumulation unit of the plurality of charge accumulation units is configured by a plurality of regions.

(6)
The imaging element according to (5), in which a plurality of regions configuring the charge accumulation units are provided in a substrate where the photoelectric conversion unit is provided, a wiring that connects the plurality of regions is provided in a wiring layer laminated on the substrate, and the first wiring and the second wiring are provided in a wiring layer different from the wiring layer.

(7)
The imaging element according to (5) or (6), in which the plurality of charge accumulation units, the plurality of transfer units, the plurality of reset units, the plurality of reset voltage control units, and the plurality of addition control units are linearly symmetrically disposed.

(8)
The imaging element according to any one of (1) to (7), further including: a phase shift circuit that generates a phase shift drive pulse signal obtained by shifting a drive pulse signal generated to correspond to a light emission control signal indicating an irradiation timing of a light emitting source to a plurality of phases in a time division manner in one frame period, in which the pixels accumulate, on the basis of the phase shift drive pulse signal, charge obtained through photoelectric conversion of reflected light that is obtained by reflecting light emitted from the light emitting source by a predetermined object, and output a detection signal in accordance with the accumulated charge.

(9)
The imaging element according to (8), in which the plurality of charge accumulation units include a first charge accumulation unit that accumulates the charge on the basis of the phase shift drive pulse signal, and a second charge accumulation unit that accumulates the charge on the basis of a signal with a phase inverted with respect to the phase shift drive pulse signal.

(10)
A distance measurement module including: a light emitting unit that emits irradiation light; and a light receiving element that receives reflected light obtained by reflecting light from the light emitting unit by an object, in which the light receiving element includes a photoelectric conversion unit that performs photoelectric conversion, a plurality of charge accumulation units that accumulate charge obtained by the photoelectric conversion unit, a plurality of transfer units that transfer the charge from the photoelectric conversion unit to each of the plurality of charge accumulation units, a first wiring that connects the transfer units in first adjacent pixels to a via formed in one of the first adjacent pixels and connected to a wiring formed in another layer, and a second wiring that connects the transfer units in second adjacent pixels to a via formed in a pixel adjacent to one of the second adjacent pixels and connected to a wiring formed in another layer, and the first wiring is connected to a redundant wiring.

REFERENCE SIGNS LIST

11 Distance measurement module
12 Light emitting unit
13 Distance measurement sensor
14 Light emission control unit
15 Light receiving unit
16 Signal processing unit
21 Pixel array unit
23 Column signal processing unit
26 Pixel drive line
31 Pixel
32 Pixel array unit
33 Drive control circuit
41 Transfer transistor
42 FD unit
43 Select transistor
44 Reset transistor
45 Amplification transistor
47 Discharge transistor
49 Additional capacity unit
51 Photodiode
52 Tap
53 Vertical signal line
54 Well contact
71 Pulse generation circuit
72 Controller
81 Phase shift circuit
82 Block driving unit
101 Period
102 Period
141 Semiconductor substrate
142 Multi-layer wiring layer
143 Anti-reflection film
144 Pixel boundary portion
145 Inter-pixel light shielding film
146 Flattening film
147 On-chip lens
151 Semiconductor region
152 Semiconductor region
153 Hafnium oxide film
154 Aluminum oxide film
155 Silicon oxide film
161 Inter-pixel separation portion
162 Inter-layer insulating film
166 Via
211 Via
311 Via
312, 313 Contact
314 Via
315 Contact
316 Via
317 Contact
318 Via
331, 332, 333, 341 Wiring
361 Contact
363 Via
371, 372, 373, 374 Wiring
375, 376 Redundant wiring
381 Contact

What is claimed is:

1. An imaging element, comprising:
a first wiring that connects predetermined transistors in first adjacent pixels to a via formed in one of the first adjacent pixels and connected to a wiring formed in another layer; and
a second wiring that connects predetermined transistors in second adjacent pixels to a via formed in a pixel that is adjacent to one of the second adjacent pixels and connected to a wiring formed in another layer,
wherein the first wiring is connected to a redundant wiring.

2. The imaging element according to claim 1, wherein a layer where the predetermined transistors are provided and a layer where the first wiring and the second wiring are provided are different layers.

3. The imaging element according to claim 1, wherein each of the vias is formed into a substantially linear shape.

4. The imaging element according to claim 1,
wherein the pixels include
a photoelectric conversion unit that performs photoelectric conversion,
a plurality of charge accumulation units that accumulate charge obtained by the photoelectric conversion unit, and
a plurality of transfer units that transfer the charge from the photoelectric conversion unit to each of the plurality of charge accumulation units, and
the predetermined transistors are the transfer units.

5. The imaging element according to claim 4,
wherein the pixels further include
a plurality of reset units that reset each of the plurality of charge accumulation units,
a plurality of reset voltage control units that controls a voltage to be applied to each of the plurality of reset units, and
a plurality of addition control units that control addition of capacity to each of the plurality of charge accumulation units, and
each charge accumulation unit of the plurality of charge accumulation units is configured by a plurality of regions.

6. The imaging element according to claim 5,
wherein a plurality of regions configuring the charge accumulation units are provided in a substrate where the photoelectric conversion unit is provided,
a wiring that connects the plurality of regions is provided in a wiring layer laminated on the substrate, and
the first wiring and the second wiring are provided in a wiring layer different from the wiring layer.

7. The imaging element according to claim 5, wherein the plurality of charge accumulation units, the plurality of transfer units, the plurality of reset units, the plurality of reset voltage control units, and the plurality of addition control units are linearly symmetrically disposed.

8. The imaging element according to claim 1, further comprising:
a phase shift circuit that generates a phase shift drive pulse signal obtained by shifting a drive pulse signal generated to correspond to a light emission control signal indicating an irradiation timing of a light emitting source to a plurality of phases in a time division manner in one frame period,
wherein the pixels accumulate, on the basis of the phase shift drive pulse signal, charge obtained through photoelectric conversion of reflected light that is obtained by reflecting light emitted from the light emitting source by a predetermined object, and output a detection signal in accordance with the accumulated charge.

9. The imaging element according to claim 8, further comprising a plurality of charge accumulation units, wherein the plurality of charge accumulation units include a first charge accumulation unit that accumulates the charge on the basis of the phase shift drive pulse signal, and a second charge accumulation unit that accumulates the charge on the basis of a signal with a phase inverted with respect to the phase shift drive pulse signal.

10. A distance measurement module, comprising:
a light emitting unit that emits irradiation light; and
a light receiving element that receives reflected light obtained by reflecting light from the light emitting unit by an object,
wherein the light receiving element includes
a photoelectric conversion unit that performs photoelectric conversion,
a plurality of charge accumulation units that accumulate charge obtained by the photoelectric conversion unit,
a plurality of transfer units that transfer the charge from the photoelectric conversion unit to each of the plurality of charge accumulation units,
a first wiring that connects the transfer units in first adjacent pixels to a via formed in one of the first adjacent pixels and connected to a wiring formed in another layer, and
a second wiring that connects the transfer units in second adjacent pixels to a via formed in a pixel adjacent to one of the second adjacent pixels and connected to a wiring formed in another layer, and
the first wiring is connected to a redundant wiring.

* * * * *